(12) United States Patent
Oh et al.

(10) Patent No.: US 9,607,678 B2
(45) Date of Patent: Mar. 28, 2017

(54) SEMICONDUCTOR MEMORY DEVICE AND MEMORY SYSTEM INCLUDING SAME

(71) Applicant: SAMSUNG ELECTRONICS CO., LTD., Suwon-si, Gyeonggi-do (KR)

(72) Inventors: Tae Young Oh, Seoul (KR); Su Yeon Doo, Seoul (KR); Seung Hoon Oh, Yongin-si (KR); Jong Ho Lee, Seoul (KR); Kwang Il Park, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 14/959,003

(22) Filed: Dec. 4, 2015

(65) Prior Publication Data
US 2016/0163377 A1 Jun. 9, 2016

(30) Foreign Application Priority Data
Dec. 5, 2014 (KR) .................. 10-2014-0174189

(51) Int. Cl.
*G11C 7/00* (2006.01)
*G11C 11/406* (2006.01)

(52) U.S. Cl.
CPC .. *G11C 11/40615* (2013.01); *G11C 11/40618* (2013.01)

(58) Field of Classification Search
CPC .......... G11C 11/40615; G11C 11/4091; G11C 11/4087
See application file for complete search history.

(56) References Cited

U.S. PATENT DOCUMENTS

| 7,088,635 | B2 | 8/2006 | Hur et al. |
| 8,208,335 | B2 | 6/2012 | Lee et al. |
| 8,441,886 | B2 | 5/2013 | Ba et al. |
| 2006/0018174 | A1* | 1/2006 | Park ............ G11C 11/406 365/222 |
| 2009/0248972 | A1 | 10/2009 | Ware et al. |
| 2013/0039135 | A1 | 2/2013 | Kang et al. |
| 2013/0051157 | A1* | 2/2013 | Park .......... G11C 11/40622 365/189.05 |

FOREIGN PATENT DOCUMENTS

| JP | 2000353383 | 12/2000 |
| JP | 2003059268 | 2/2003 |
| JP | 2008192262 | 8/2008 |
| JP | 2012252742 | 12/2012 |
| KR | 1020030012812 | 2/2003 |
| KR | 1020040008025 | 1/2004 |
| KR | 1020050104807 | 11/2005 |
| KR | 1020120020395 | 3/2012 |

* cited by examiner

*Primary Examiner* — Richard Elms
*Assistant Examiner* — Mohammed A Bashar
(74) *Attorney, Agent, or Firm* — F. Chau & Associates, LLC

(57) ABSTRACT

A method of operating a semiconductor memory device is provided as follows. The semiconductor memory device receive a bank address for a first bank including a first word line, a second word line and a third word line. The semiconductor memory device receive a first row address to activate the first world line for a read operation or a write operation. The semiconductor memory device generates a second row address to refresh a plurality of memory cells associated with the second word line.

17 Claims, 19 Drawing Sheets

SEMICONDUCTOR MEMORY DEVICE AND MEMORY SYSTEM INCLUDING SAME

CROSS-REFERENCE TO RELATED APPLICATION

This application claims priority under 35 U.S.C. §119(a) to Korean Patent Application No. 10-2014-0174189 filed on Dec. 5, 2014, the disclosure of which is incorporated by reference herein in its entirety.

TECHNICAL FIELD

The present inventive concept relates to s a semiconductor memory device and a memory system including the same.

DISCUSSION OF RELATED ART

Dynamic random access memory (DRAM) cells store a charge amount corresponding to data to be stored therein. The DRAM cells are refreshed periodically to keep the data stored. However, when a high-speed operation is required in the semiconductor memory device, time consumed for the refresh causes the operation speed of the semiconductor memory device to decrease.

SUMMARY

According to an exemplary embodiment of the present inventive concept, a method of operating a semiconductor memory device is provided as follows. The semiconductor memory device receive a bank address for a first bank including a first word line, a second word line and a third word line. The semiconductor memory device receive a first row address to activate the first world line for a read operation or a write operation. The semiconductor memory device generates a second row address to refresh a plurality of memory cells associated with the second word line.

According to an exemplary embodiment of the present inventive concept, a semiconductor memory device is provided as follows. A command decoder generates an activation command. A bank activation logic receives a bank address and the activation command, generating a bank activation signal. Memory bank units include a first bank unit. If the bank address indicates to the first bank unit, the first bank unit performs the activation command and an active refresh operation and generates a first refresh done signal. If the bank address does not indicate to the first bank unit for a predetermined time, the first bank unit performs a per-bank self-refresh operation. The performing of the activation command and the performing of the active refresh operation are initiated by the bank activation signal.

According to an exemplary embodiment of the present inventive concept, a semiconductor memory system is provided as follows. A memory controller issues a first activation command and a first row address. A semiconductor memory receives the first activation command and the first row address, generates a second row address, activates the first word line selected by the first row address and refreshes memory cells associated with the second row address. The refreshing and the activating are initiated by the first activation command.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
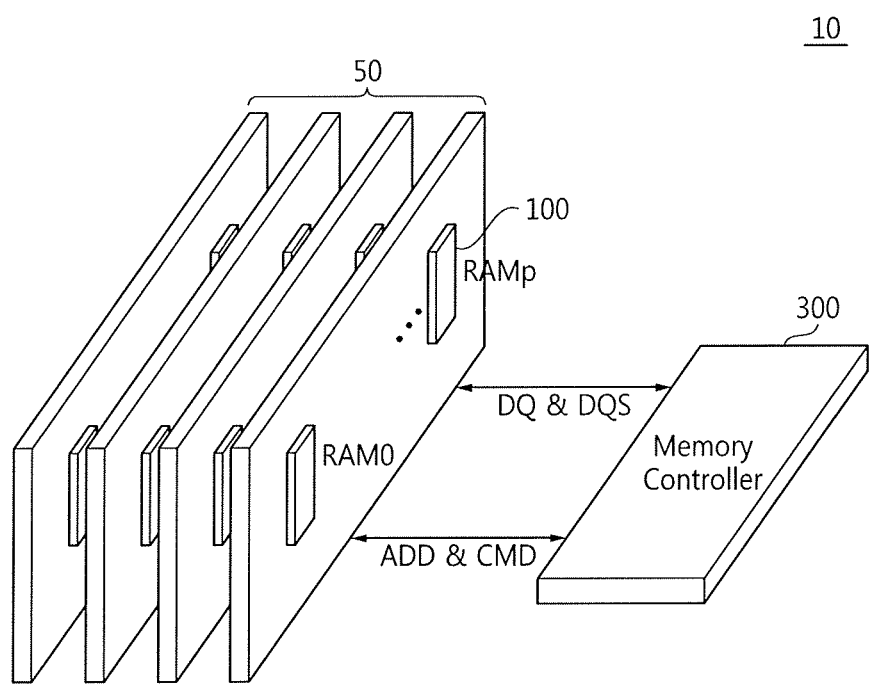
FIG. 1 is a schematic diagram of a memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 shows a memory system 10 according to an exemplary embodiment of the inventive concept. The memory system 10 includes a plurality of memory modules 50 and a memory controller 300.

Each memory module 50 includes a plurality of dies RAM0 through RAMp. Each die corresponds to a semiconductor memory device. Each memory module 50 may be implemented as a single in-line memory module (SIMM) or a dual in-line memory module (DIMM).

The dies RAM0 through RAMp may operate in response to address information ADD and a command signal CMD received from the memory controller 300 and may communicate a data signal DQ and a data strobe signal DQS with the memory controller 300. The data signal DQ may include error information transmitted from the dies RAM0 through RAMp to the memory controller 300. If a die does not process a command received from a memory controller due to an activation conflict, the die may generate error information to inform the memory controller that the command is not performed. In an exemplary embodiment, each die may include a pin through which a memory controller detects the error information from a die. The error information will be described in detail with reference to FIG. 9.

The memory controller 300 may control the overall operation of the memory module 50. The overall operation may include a read operation, a write operation and/or a refresh operation. The memory controller 300 may be implemented as a part of a system on chip (SoC) for a mobile application, for example.

Figure 2:
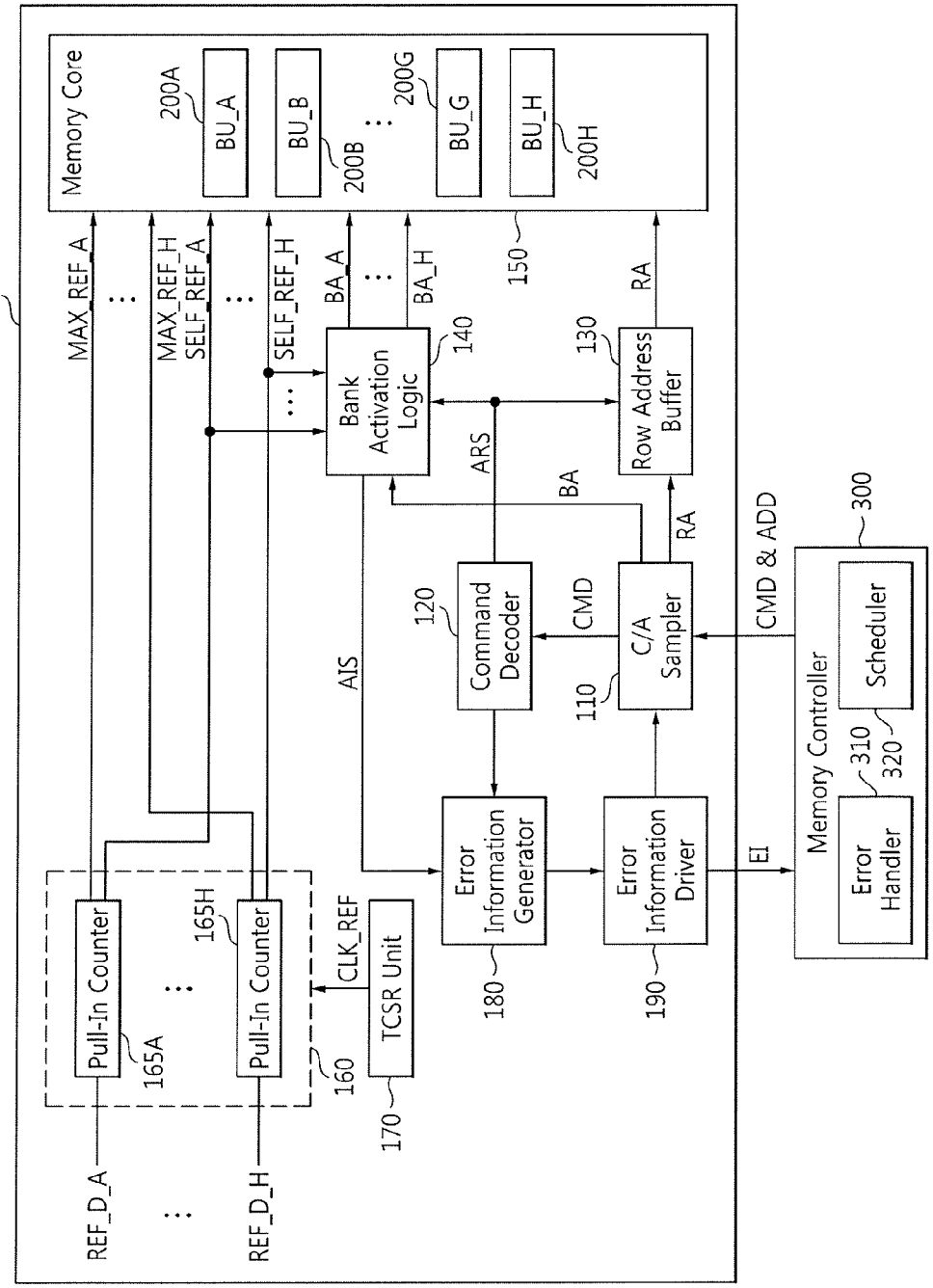
FIG. 2 is a detailed block diagram of the memory system of FIG. 1 according to an exemplary embodiment of the present inventive concept.
Figure 3:
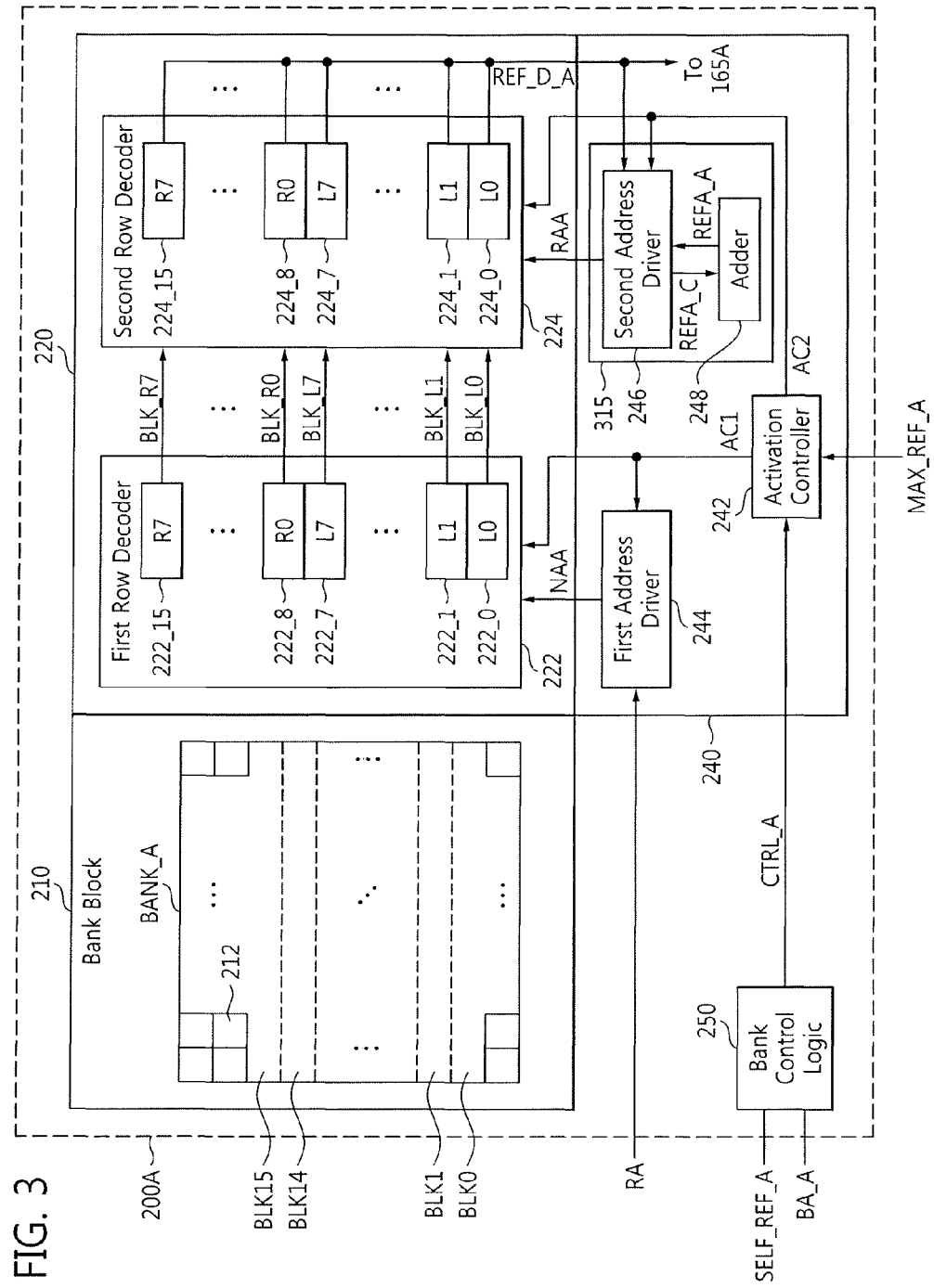
FIG. 3 is a detailed block diagram of a first bank unit of FIG. 2 according to an exemplary embodiment of the present inventive concept.
Figure 3A:
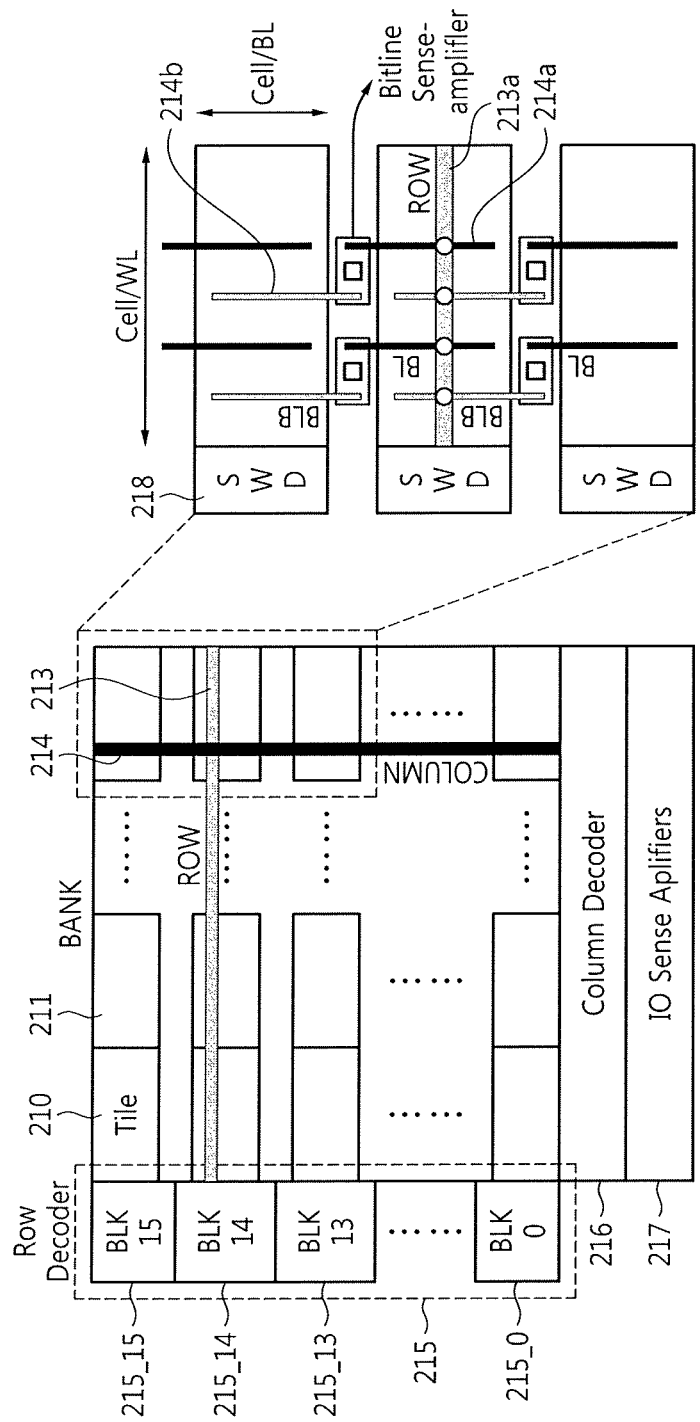
FIG. 3A is an open bitline architecture of the first bank unit of FIG. 3 according to an exemplary embodiment of the present inventive concept.

FIG. 2 shows a block diagram of the memory system 10 of FIG. 1 according to an exemplary embodiment of the present inventive concept. FIG. 3 shows a block diagram of a first bank unit 200A of FIG. 2. FIG. 3A shows a bank structure having an open-bit line architecture according to an exemplary embodiment. Referring to FIGS. 1 through 3, the memory system 10 includes a semiconductor memory device 100 and the memory controller 300. FIG. 2 shows a die (e.g., RAM0) included in the memory module 50 of FIG. 1 and the memory controller 300. Elements 110 through 190 of FIGS. 2 and 3 may be formed in software, hardware, or a combination thereof.

The semiconductor memory device 100 may include a command/address (C/A) sampler 110, a command decoder 120, a row address buffer 130, a bank activation logic 140, a memory core 150, a counter block 160, a temperature compensate self-refresh (TCSR) unit 170, an error information generator 180, and an error information driver 190.

The C/A sampler 110 may sample a command/address information CMD & ADD received from the memory controller 300 and may transmit the command CMD to the command decoder 120 and a row address RA to the row address buffer 130. The C/A sampler 110 may also transmit a bank address BA to the bank activation logic 140.

The command/address information CMD & ADD may be formed of a packet including a command CMD and an address ADD. The sampling may be an operation of separating the command CMD and the address ADD from the command/address information CMD & ADD. The command CMD is information requesting a particular operation of the semiconductor memory device 100. The command CMD may include a read command, a write command, or an activation command. The address ADD is information for selecting a bank, row and column addresses of a memory cell to be performed by the command CMD. For example, the address ADD may include the row address RA and the bank address BA.

The command decoder 120 may interpret the command CMD and transmit a control signal to a logic that controls an operation corresponding to the command CMD. For instance, when the command CMD is an activation command, the command decoder 120 may transmit an activation recognition signal ARS to the bank activation logic 140. The activation recognition signal ARS may be a signal generated from the command CMD including the activation command. The command decoder 120 may also provide timing of error information when the error information generator 180 generates the error information.

The row address buffer 130 may temporarily store the row address RA and transmit the row address RA to the memory core 150. The bank activation logic 140 may generate bank activation signals BA_A through BA_H based on the activation recognition signal ARS and the bank address BA to activate at least one of a plurality of bank units BU_A through BU_H or 200A through 200H included in the memory core 150. Each of the bank units 200A through 200H may be independently selected using the bank address BA in response to the activation recognition signal ARS. For example, one bank may be selected or two or more banks may be selected or all banks are selected. If all banks are selected, the bank activation signals BA_A through BA_H may be at a high level at the same time.

In response to the activation recognition signal ARS having a high level, the bank activation logic 140 may determine which of the bank units 200A through 200H will be activated based on the bank address BA. The bank activation logic 140 may respond to the level of the activation recognition signal ARS. For instance, if the bank address BA corresponding to an activation command may correspond to the first and second bank units 200A and 200B, the bank activation signals BA_A and BA_B may the high level.

Alternatively, the bank activation logic 140 may respond to a transition of the activation recognition signal ARS. For example, the bank activation logic 140 may respond to, but is not limited to, a transition of a low level to a high level of the activation recognition signal.

The bank activation logic 140 may also generate an activation impossibility signal AIS if the bank activation logic 140 detects an activation conflict. The bank activation logic 140 receives self-refresh signals SELF_REF_A through SELF_REF_H, the activation recognition signal ARS, and the bank address BA, and if detecting an activation conflict, transmits the activation impossibility signal AIS to the error information generator 180. In this case, the self-refresh signals SELF_REF_A through SELF_REF_H are internally generated from the counter block 160. For instance, if the bank activation logic 140 receives the bank address BA corresponding to the first bank unit 200A and the activation recognition signal ARS having the high level and if the first bank unit 200A is performing a self-refresh operation on the first bank unit 200A in response to the first self-refresh signal SELF_REF_A having a high level, the bank activation logic 140 may generate the activation impossibility signal AIS having a high level to inform the memory controller 300 that the semiconductor memory device 100 is not able to perform a command on the first bank unit while performing the self-refresh on the first bank unit. The self-refresh operation will be described with reference to FIG. 3 later.

The memory core 150 includes a plurality of the bank units 200A through 200H. For example, the memory core 150 includes eight bank units 200A through 200H. The inventive concept is not limited thereto, and the number of the bank units may be less than or greater than eight.

The bank units 200A through 200H operate in substantially the same manner, and for the convenience of descriptions, the operation of the first bank unit 200A only will be described with reference to FIG. 3. The first bank unit 200A includes a bank block 210, a row decoder block 220, a decoder control block 240, and a bank control logic 250.

The bank block 210 includes a first bank BANK_A in which a plurality of memory cells 212 is arranged in a matrix. The memory cells 212 may store data of at least one bit. The memory cells 212 may be implemented as non-volatile memory cells that retain data even when power is cut off or volatile memory cells that retain data only while power is being supplied. For example, the memory cells 212 may be dynamic random access memory (DRAM) cells, static RAM (SRAM) cells, synchronous DRAM (SDRAM) cells, electrically erasable programmable read-only memory (EEPROM) cells, flash memory cells, magnetic RAM (MRAM) cells, conductive bridging RAM (CBRAM) cells, ferroelectric RAM (FeRAM) cells, phase-change RAM (PRAM) cells, or resistive RAM (RRAM or ReRAM) cells.

In FIG. 3A, the first bank BANK_A is divided into a plurality of blocks 211. Each of the blocks may have a sub-matrix form which includes memory cells 212 sharing a sub-word line driver 218 and a bitline sense amplifier 219. The sub-word line driver 218 of each block 211 drives a word line 213 within a block. The bitline sense amplifier 219 of each block 211 senses data on a local bit data line BL. Each block 211 includes a sub-word line driver 218 and a bitline sense amplifier 219, and thus word lines and bit lines of each block 211 may be independently controlled such that a read operation, a write operation, an erase operation, or a refresh operation is performed independently on each block 211. Each of the blocks may include 1024 word lines and 1024 bit lines.

The blocks are arranged in an open bit line structure sharing a bitline sense amplifier between adjacent two blocks along a direction which a global bit line pair 214 including a global bit and a global complementary bit line is extended. In the open bit line structure, each bit line sense amplifier 219 is connected to a local bit line BL of a first block and a local complementary bit line BL_B of a second block adjacent to the first block. If two adjacent blocks are activated at the same time or during an overlapped time, data corruption occurs due to the sharing of the bitline sense amplifier 219. In this case, two adjacent blocks are not activated at the same time or during an overlapped time.

In this case, a local word line 213a of each banks in the same row may be electrically connected to a global word line 214 extending in a row direction. A local bitline 214a of each block may be connected to a global bitline of the global bit line pair 214, extended in a column direction, and a local complementary bitline 214b of each block may be connected to a global complementary bitline of the global bit line pair 214 extended in the column direction.

Referring back to FIG. 3, the row decoder block 220 may include a first row decoder 222 and a second row decoder 224. The first row decoder 222 may correspond to a row decoder 215 of FIG. 3A. For the convenience of description, the first bank BANK_A includes 16 blocks BLK0 through BLK15. However, the present inventive concept is not limited thereto, and the first bank BANK_A may include various numbers of blocks and be arranged in a matrix form.

The first row decoder 222 may include sub decoders 222_0 through 220_15 which respectively activate the blocks BLK0 through BLK15. The sub decoders 222_0 through 222_15 of FIG. 3 may correspond to sub decoders 215_0 through 215_15 of the row decoder 215 in FIG. 3A. Here, to activate a block is to activate a word line included in a block in response to an activation command.

Each of the sub decoders 222_0 through 222_15 may activate one of the blocks BLK0 through BLK15 according to a normal activation address NAA and a first activation control signal AC1. The normal activation address NAA may refer to an row address for a normal operation. For instance, if the normal activation address NAA corresponds to one of the word lines included in a block BLK0 and if the first activation control signal AC1 is at a high level, the sub decoder 222_0 activates a word line in the block BLK0 corresponding to the normal activation address NAA. A read operation or a write operation may be performed on the activated word line according to a read or write command. At this time, the sub decoder 222_0 may transmit a block activation signal BLK_L0 to the second row decoder 224 to indicate that the block BLK0 has been activated.

The second row decoder 224 may include sub decoders 224_0 through 224_15 which respectively activate the blocks BLK0 through BLK15. Each of the sub decoders 224_0 through 224_15 may selectively activate one of the blocks BLK0 through BLK15 according to a refresh activation address RAA and a second activation control signal AC2. The refresh activation address RAA may refer to an row address for an active refresh operation. For instance, if the refresh activation address RAA corresponds to one of the word lines included in the block BLK8 and if the second activation control signal AC2 is at a high level, the sub decoder 224_8 activates a word line in the block BLK8. A refresh operation may be performed on the activated word line.

The refresh activation address RAA may include row address information to be refreshed. In an exemplary embodiment, the refresh activation address RAA may include one row address information in a block or two or more row address information to be refreshed in different blocks from each other. For example, if the refresh activation address RAA includes address information about two word lines included in different blocks, two different blocks are activated at the same time for a refresh operation. In this case, the two different blocks may be selected among blocks which are not performing a normal operation including a read operation and/or a write operation.

The sub decoders 224_0 through 224_15 may selectively activate the blocks BLK0 through BLK15, respectively, based on block activation signals BLK_0 through BLK_15 received from the first row decoder 222.

For instance, if the block activation signal BLK_0 is at a high level and if the refresh activation address RAA corresponds to a word line included in the block BLK0, the sub decoder 224_0 does not activate the block BLK0 for a refresh operation because the block BLK0 is activated for a normal operation. In addition, if the block activation signal BLK_0 is at the high level and if the refresh activation address RAA includes a word line included in the block BLK1 and a word line included in BLK15, the sub decoder 224_0 does not activate the blocks BLK1 and BLK15. This is because if the first bank BANK_A has an open bit line structure as shown in FIG. 3A, not only a block that has been activated but also blocks adjacent to the activated block cannot be activated at the same time. If the blocks BLK1 and BLK15 adjacent to the block BLK0 are activated for a refresh operation and if the block BLK0 is indicated as having been activated by the block activation signal BLK_0, data of a normal operation is corrupted due to the sharing of bitline sense amplifier between the block BLK0 and the block BLK1 and between the block BLK0 and the block BLK15. The "corrupted" means that reading of data from a memory cell is not properly performed or writing of data into a memory cell is not properly performed. In this case, the block BLK15 is adjacent to the block BLK0, and therefore, the blocks BLK15 and BLK0 cannot be activated at the same time. If two blocks shares a bitline sense amplifier as shown in FIG. 3A, such two blocks may be referred to be adjacent to each other. If the refresh activation address RAA corresponds to a word line within a block to which a normal operation is performed or a word line within a block adjacent to the block of the normal operation, a block conflict occurs and a refresh operation is prohibited to prevent data corruption of a normal operation.

Once blocks among the blocks BLK0 through BLK15 corresponding to the refresh activation address RAA are activated, one or more sub decoders among the sub decoders 224_0 through 224_15 associated with the activated blocks may generate a refresh done signal REF_D_A. For instance, if the refresh activation address RAA includes addresses corresponding to the blocks BLK8 and BLK0 and if activation of both blocks BLK0 and BLK8 is completed, the refresh done signal REF_D_A having a high level may be generated. If at least one of the blocks BLK0 and BLK15 has not been activated, the refresh done signal REF_D_A having a low level may be generated.

The decoder block 220 includes two separated decoders of the first row decoder 222 and the second row decoder 224 which are physically separated from each other. However, the inventive concept is not limited thereto. For example, the decoder block 220 may be formed of a decoding logic to be used for both a normal operation and a refresh operation. In this case, the decoding logic of the decoder block may serve as the first row decoder 222 and the second row decoder 224 in a time division multiplexing method. In an exemplary embodiment, the decoder block 220 may include a decoding logic shared by the first row decoder 222 and the second row decoder 224. In this case, a decoding operation for a normal operation and a decoding operation for a refresh operation is performed in a time division multiplexing method.

The bank control logic 250 generates a bank control signal CTRL_A based on the first self-refresh signal SELF_REF_A and the first bank activation signal BA_A. For example, if one of the first self-refresh signal SELF_REF_A and the first bank activation signal BA_A is at the high level, the bank control logic 250 may generate a bank control signal CTRL_A for activating word lines included in the first bank BANK_A. The bank control signal CTRL_A may include a plurality of control signals and information about which of the first self-refresh signal SELF_REF_A and the first bank activation signal BA_A is at the high level.

The decoder control block 240 includes an activation controller 242, a first address driver 244, a second address generator 315. In an exemplary embodiment, the second address generator 315 includes a second address driver 246, and an adder 248. In an exemplary embodiment, the second address generator 315 may be implemented using a counter logic of which a counter value increases or decreases in response to, for example, the refresh done signal REF_D_A.

The activation controller 242 generates the first activation control signal AC1 and the second activation control signal AC2 based on the bank control signal CTRL_A. For example, if the bank control signal CTRL_A indicates that the first bank activation signal BA_A is at the high level and the first self-refresh signal SELF_REF is at the low level, the activation controller 242 generates the first activation control signal AC1 having the high level and the second activation control signal AC2 having the high level. In this case, the bank control signal CTRL_A includes the first activation control signal AC1 and the second activation control signal AC2.

Figure 4:
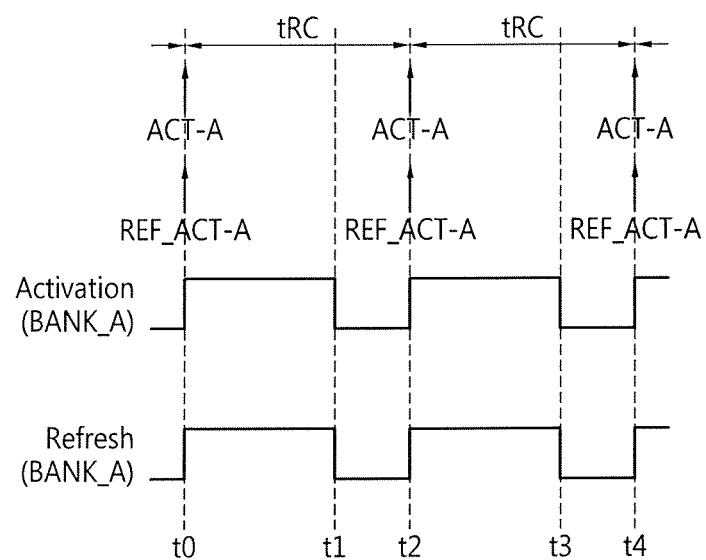
FIG. 4 is a timing diagram of an active refresh operation of a semiconductor memory device of FIG. 2 according to an exemplary embodiment of the present inventive concept.

In this case, an activation command and an active refresh operation may be performed as shown in FIG. 4. For example, the first bank activation signal BA_A may initiate to perform the activation command on a word line selected by the no activation address NAA and to perform the active refresh operation on a word line selected by the refresh activation address RAA.

If a maximum refresh signal MAX_REF_A is at a high level, the activation controller 242 may generate the second activation control signal AC2 having a low level. This is because a refresh operation is unnecessary when the maximum refresh signal MAX_REF_A is at the high level.

If the bank control signal CTRL_A indicates that the first self-refresh signal SELF_REF_A is at the high level and the first bank activation signal BA_A is at the low level, the activation controller 242 may generate the second activation control signal AC2 having the high level. For example, if the first self-refresh signal SELF_REF_A is at the high level, a self-refresh operation is performed on the bank 200A by the second row decoder 224. For this reason, only the second activation control signal AC2 is at the high level.

The first address driver 244 may scramble the row address RA into the normal activation address NAA and may transmit the normal activation address NAA to the first row decoder 222 in synchronization with the first activation control signal AC1. At least two bits of the row address RA may be switched to each other to generate the normal activation address NAA. The address scrambling will be described in detail with reference to FIG. 8.

The second address driver 246 provides the refresh activation address RAA for the second row decoder 224. The second address driver 246 also provides the refresh activation address RAA to the adder 248 as a current refresh address REFA_C. The adder 248 may generate a next refresh address REFA_A by adding a predetermined number to the current refresh address REFA_C. For example, the predetermined number may be one (1). An initial refresh activation address, i.e., the refresh activation address RAA may be randomly determined. Alternatively, the initial refresh activation address may be predetermined to be a specific address.

The second address driver 246 provides the next refresh address REFA_A to the second row decoder 224 as the new refresh activation address RAA in synchronization with the second activation control signal AC2. The second address driver 246 may determine whether a refresh operation has been performed with respect to the refresh activation address RAA based on the refresh done signal REF_D_A and may store the determination result. For instance, if the refresh activation address RAA corresponds to a word line included in the block BLK0 which has been activated for a normal operation, a refresh operation based on the refresh activation address RAA is prohibited. In this case, the refresh done signal REF_D_A is at the low level, and the refresh activation address RAA corresponding to the word line may be provided to the second address driver 246 in a following refresh operation.

In the operation of the first bank unit 200A, if an activation command is received from the memory controller 300, the first row decoder 222 may activate a word line corresponding to the normal activation address NAA according to the control of the activation controller 242 and simultaneously the second row decoder 224 may activate a word line corresponding to the refresh activation address RAA according to the control of the activation controller 242. For example, if the semiconductor memory device 100 receives an activation command of a read operation or a write operation, activation of a word line corresponding to the activation command may be performed simultaneously with a refresh operation on a word line included in a block different from the block that includes the word line activated by the activation command or a block which is not adjacent to the block including the word line activated in a bank unit for a read operation or a write operation. Such a refresh operation may be referred to as an active refresh operation. According to an exemplary embodiment, the active refresh operation is performed without a control from the memory controller 300.

Without control of the memory controller 300, the second row decoder 224 may activate a word line corresponding to the refresh activation address RAA according to the control of the activation controller 242 based on the first self-refresh signal SELF_REF_A which is internally generated by the counter block 160 of FIG. 2. Such a refresh operation may be referred to as a self-refresh operation. In an exemplary embodiment, the self-refresh operation may be performed in a unit of a bank in response to self-refresh signal SELF_REF_A through SELF_REF_H generated from the counter block 160. Hereinafter, the self-refresh signal may be referred to as a per-bank self-refresh signal or a per-bank self-refresh command.

The counter block 160 includes a plurality of pull-in counters 165A through 165H. The pull-in counters 165A through 165H are associated with the bank units BU_A through BU_H, respectively. The pull-in counters 165A through 165H may count refresh done signals REF_D_A through REF_D_H, respectively. Each of the refresh done signals REF_D_A through REF_D_H indicates whether a refresh operation has been completed or not. The pull-in counters 165A through 165H may store count values, respectively. The pull-in counters 165A through 165H may have a maximum value and a minimum value. For instance, the maximum value may be 7 and the minimum value may be 0. However, the inventive concept is not limited thereto, and the maximum and minimum values may be smaller or greater than 7.

As shown in FIG. 2, each bank has an independent counter to monitor the status of an active refresh operation on the bank. For example, the first bank unit 200A is coupled to the first pull-in counter 165A. In response to REF_D_A, shown in FIG. 3, generated from the second row decoder 224 of the first bank unit 200A, the first pull-in counter 165A increases its counter value stored therein. Similarly, the remaining bank units 200B to 200H are coupled to the remaining pull-in counters 165B to 165H, respectively. For the convenience of description, further descriptions of the remaining bank units 200B to 200H and the remaining pull-in counters 165B to 165H are omitted herein. Hereinafter, for the convenience of description, an operation of the first pull-in counter 165A will be described.

If the count value of the pull-in counter 165A reaches the maximum value, the pull-in counter 165A may generate a maximum refresh signal MAX_REF_A. In response to the maximum refresh signal MAX_REF_A, the second row decoder 224 of the first bank unit 200A does not perform an active refresh operation. If the count value of the pull-in counter 165A reaches the minimum value, the pull-in counter 165A may generate the self-refresh signals SELF_REF_A. In this case, the first bank unit 200A is in a refresh starvation, and if memory cells within the first bank unit 200A are not refreshed, the memory cells lose data stored therein. In response to the self-refresh signal SELF_REF_A, the second row decoder 224 may perform a self-refresh operation on the first bank unit 200A. The operation of the pull-in counter 165A will be further described with reference to an exemplary embodiment of FIG. 5.

The other pull-in counters 165B to 165H may operate as described above with respect to the first pull-in counter 165A, and thus further descriptions of the other pull-in counters 165B to 165H are omitted herein for the convenience of the descriptions.

Figure 5:
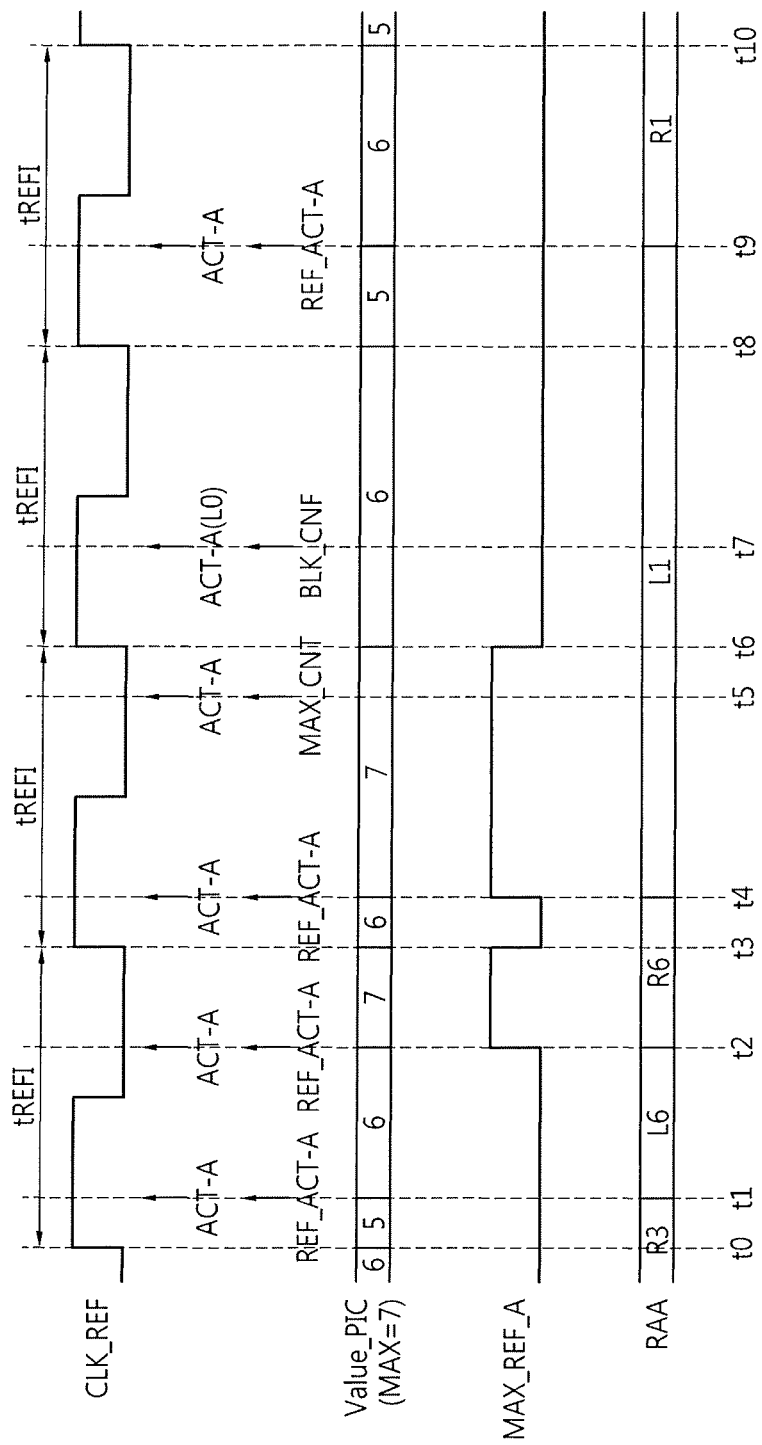
FIG. 5 is a timing diagram of the semiconductor memory device of FIG. 2 according to an exemplary embodiment of the present inventive concept.

The TCSR unit 170 may generate a refresh clock signal CLK_REF of which a period is a refresh time interval (tREFI in FIG. 5). The refresh time interval tREFI is an average periodic refresh interval time. For instance, the memory cells of the first bank unit 200A are to be refreshed within a refresh window tREFW to keep data stored therein, and thus the refresh time interval tREFI is calculated by dividing the refresh window tREFW with the number of total word lines in the first bank unit 200A. The refresh window tREFW may refer to cell retention time for which data stored in a memory cell is preserved without being refreshed. If the first bank unit 200A includes 16 blocks and if each block includes 1024 word lines and if the refresh window tREFW is 64 milliseconds, the refresh time interval tREFI may be 3.9 μs. The refresh window tREFW may vary with the internal temperature of the semiconductor memory device 100, and thus the refresh time tREFI may vary the internal temperature of the semiconductor memory device 100 as well. When the internal temperature of the semiconductor memory device 100 increases, the refresh time interval tREFI may decrease. The inventive concept is not limited thereto, and thus the refresh window tREFW and the number of word lines may vary.

The pull-in counters 165A through 165H may detect an edge (e.g., a rising edge) of the refresh clock signal CLK_REF and decrease the count value by a predetermined value (e.g., 1) at each detection of the rising edge, for example. In the case, the detection of the rising edge means elapse of the refresh time interval tREFI.

Figure 9:
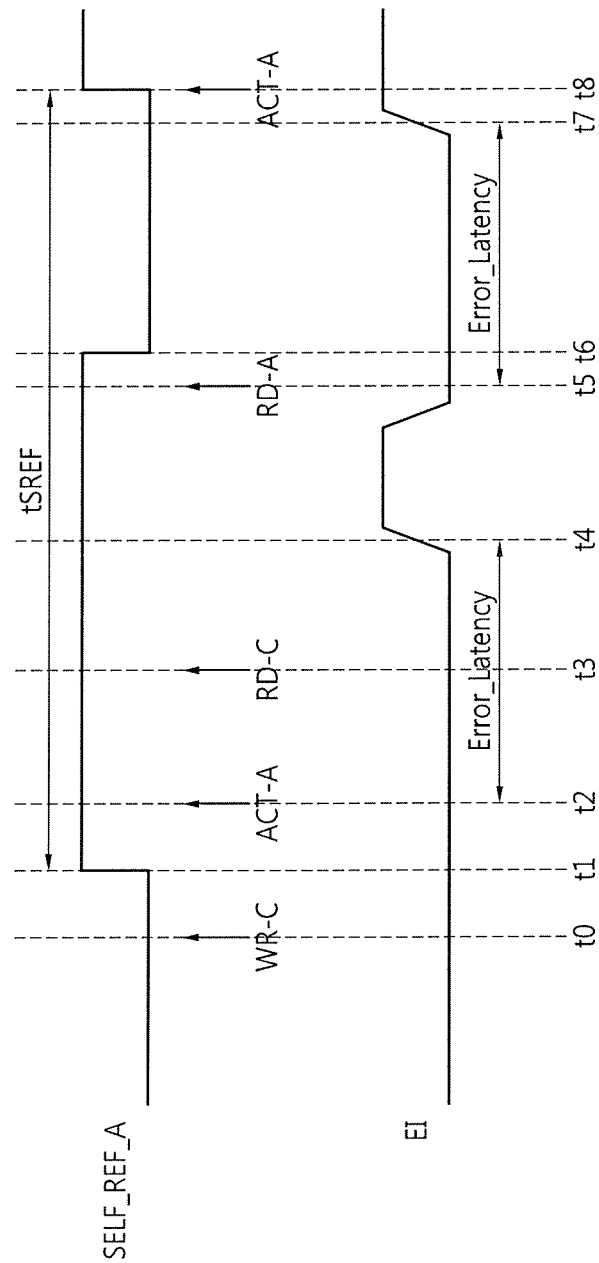
FIG. 9 is a detailed timing diagram of the self-refresh operation of the semiconductor memory device of FIG. 2 according to an exemplary embodiment of the present inventive concept.

The error information generator 180 generates error information EI which is driven by the error information driver 190 to the memory controller 300. In response to an activation impossibility signal AIS having a high level, the error information generator 180 generates the error information EI. If the bank activation logic receives an activation command for the bank unit BU_A to which a self-refresh operation is being performed, the bank activation logic 140 generates the activation impossibility signal AIS having the high level and the error information generator 180 generates the error information EI to notify the memory controller that the bank unit BU_A is being performed by the self-refresh operation and thus a read operation or a write operation to the bank unit BU_A requested by the memory controller is not performed until the self-refresh operation is completed. As shown in FIG. 9, the error information generator 180 may generate the error information EI having a predetermined error latency for the activation command received from the command decoder 120. In an exemplary embodiment, the memory controller 300 may identify which active command is not performed by measuring the predetermined error latency.

The error information driver 190 may sense and amplify the error information EI and may transmit the error information EI to the memory controller 300 in a digital format. The memory controller 300 may recognize based on the error latency of the error information EI which activation command of a read operation or a write operation has not been performed due to a self-refresh operation. The memory controller 300 may reissue the activation command which was not performed to the semiconductor memory device 100.

The memory controller 300 includes an error handler 310 and a scheduler 320. The error handler 310 receives the error information EI from the semiconductor memory device 100, and identify the activation command having an activation conflict based on the error latency as shown in FIG. 9. In this case, the scheduler 320 may hold the activation command, and reissue the activation command to the semiconductor memory device 100 after the self-refresh operation is completed.

According to an exemplary embodiment, the semiconductor memory device 100 may perform a refresh operation without receiving a separate refresh command from the memory controller 300. For example, the active refresh operation and the self-refresh operation are performed without any instruction from the memory controller. The active refresh operation is internally performed in the same bank where a read or write operation is performed. For example, in response to an activation command of a read or write operation, the active refresh operation is performed. In addition, the refresh operation is performed without control of a memory controller in the background in one bank in which a word line is being activated according to an activation command for a normal operation, so that the operation speed of the semiconductor memory device 100 is increased.

FIG. 4 is a timing diagram showing an active refresh operation of the semiconductor memory device 100 of FIG. 2 according to an exemplary embodiment. FIG. 5 is a timing diagram showing how counter values change in the operation of the semiconductor memory device 100 of FIG. 2.

Referring to FIGS. 1 through 5, FIG. 4 shows that activation commands for the first bank BANK_A are received at each row cycle time tRC. The row cycle time tRC is a minimum period or a minimum number of cycles necessary for a memory to complete a read or write operation. A read operation is completed by performing an activation command, a read command and a precharge command. A write operation is completed by performing an activation command, a write command and a precharge command. The commands for the read or write operation are performed within the row cycle time tRC. In this case, the activation commands ACT-A are received at each start timing of the row cycle time tRC. For the convenience of description, the read command, the write command and the precharge command are not shown on FIG. 4. Here, receiving an activation command is denoted by ACT-A and starting an active refresh in response to the activation command is denoted by REF_ACT-A.

An activation signal is a conceptual signal indicating whether a row in the first bank BANK_A is activated or not. During the high level of the activation signal, the row in the first bank BANK_A is activated. During the low level of the activation signal, the row in the first bank BANK_A is precharged or not activated.

A refresh signal is a conceptual signal indicating whether a row in the first bank BANK_A is refreshed or not. The activation signal may be at a high level when the row in the first bank BANK_A is refreshed and may be at a low level when any of the rows in the first bank BANK_A is not refreshed. In other words, the refresh signal informs whether a refresh operation is performed when a row in the first bank BANK_A is activated. The activation signal and the refresh signal may be internally generated by the bank control logic 250.

If an activation command for the first bank BANK_A is received at a time point t0, a row (or a word line) corresponding to the normal activation address NAA is activated in response to the activation command, and an active refresh operation corresponding to the refresh activation address RAA may be performed in the first bank unit 200A. The activation operation and the active refresh operation may end at a time point t1 when a precharge command is received.

When a new activation command for the first bank BANK_A is received at a time point t2, an operation of activating a row corresponding to the new normal activation address NAA and an active refresh operation corresponding to the new refresh activation address RAA may be performed in the first bank unit 200A.

Operations similar to those performed at the time points t1 and t2 may be repeated at following time points t3 and t4. In an exemplary embodiment, if an activation command for the first bank BANK_A is received, an operation of activating a row corresponding to the normal activation address NAA and an active refresh operation corresponding to the refresh activation address RAA may be performed simultaneously. Alternatively, the active refresh operation of the refresh address RAA may be performed a predetermined time after the operation of activating the row of the normal activation address NAA is performed. For example, if the activation command for the first bank BANK_A is received, both active refresh operation and the normal activation operation are performed with a predetermined time delay.

FIG. 5 shows how a counter value of a pull-in counter 165A changes according to an operation of the semiconductor memory device 100 of FIG. 1. For the convenience of description, it is assumed that a first bank unit 200A is activated. The refresh clock signal CLK_REF has a period of the refresh time interval tREFI and a count value Value_PIC is a count value stored in the first pull-in counter 165A. The temperature compensate self-refresh (TCSR) unit 170 generates the refresh clock signal CLK_REF based on the refresh time interval tREFI and the internal temperature of the semiconductor memory device 100.

The count value Value_PIC decreases as the refresh time interval tREFI has elapsed, and the count value Value PIC increases if an active refresh operation has performed. For the convenience of description, the count value Value_PIC is assumed to decrease in response to a rising edge of the refresh clock signal CLK_REF. The present inventive concept is not limited thereto, and the count value Value_PIC may decrease in response to a falling edge of the refresh clock signal CLK_REF. For the convenience of description, it is assumed that an activation command for a read operation or a write operation is performed on a first block BLK0 of the first bank 200A.

As shown in FIG. 5, at time point t0, the count value Value_PIC decrease from 6 to 5 in response to the rising edge of the refresh clock signal CLK_REF. For the convenience of description, the starting value of the count value Value_PIC is 6, but the present inventive concept is not limited thereto. At time point t1, an activation command with respect to the normal activation address NAA and an active refresh operation with respect to the block BLK6 corresponding to the refresh activation address RAA may be performed simultaneously at the time point t1. In this case, there is no conflict between the block BLK0 for the normal activation operation of a read operation or a write operation and the block BLK6 for the active refresh operation performed with the normal activation operation. As the active refresh operation is performed on the first bank 200A, the count value Value_PIC of the first bank unit 200A is increased from 5 to 6.

At time point t2, an operation of activating a row within the block BLK0 according to the normal activation address NAA and an active refresh operation on the block BLK14 corresponding to the refresh activation address RAA may be performed simultaneously, for example. In this case, there is no conflict between the first block BLK0 and the block BLK14. As the active refresh operation is performed, the count value Value_PIC is increased from 6 to 7 and the maximum refresh signal MAX_REF_A transits to the high level, which represents that memory cells of the first bank unit 200A are all refreshed within a refresh window tREFW.

At time point t3, the refresh time tREFI has elapsed and the count value Value_PIC decreases from 7 to 6. Accordingly, the maximum refresh signal MAX_REF_A transits to the low level.

At time point t4, an operation of activating a row corresponding to the normal activation address NAA and an active refresh operation on the block BLK5 corresponding to the refresh activation address RAA may be performed simultaneously at the time point t4. As the active refresh operation is performed, the count value Value_PIC is increased from 6 to 7 and the maximum refresh signal MAX_REF_A transits to the high level.

At a time point t5, an operation of activating a row corresponding to the normal activation address NAA is performed, but since the maximum refresh signal MAX_REF_A is at the high level, an active refresh operation is not performed according to the control of the activation controller 242. Such a process in which an active refresh operation is not performed according to the maximum refresh signal MAX_REF_A is denoted by MAX_CNT. This process is provided to prevent power consumption of the semiconductor memory device 100 from increasing due to unnecessary refresh operations.

Since the refresh time tREFI has elapsed at the time point t6, the count value Value_PIC decreases from 7 to 6. Accordingly, the maximum refresh signal MAX_REF_A transits to the low level.

If a row corresponding to the normal activation address NAA is included in the block BLK0 at a time point t7, an operation of activating the row is performed, but an active refresh operation of the block BLK1 including a row corresponding to the refresh activation address RAA is not performed simultaneously since the block BLK1 is adjacent to the block BLK0. Such a phenomenon in which an active refresh operation is not performed due to block conflict is denoted by BLK_CNF. This phenomenon may happen when the first bank BANK_A has an open bit line structure.

Thereafter, operations similar to those performed at the time points t0, t1, and t3 may be repeated at following time points t8 through t10.

Figure 6:
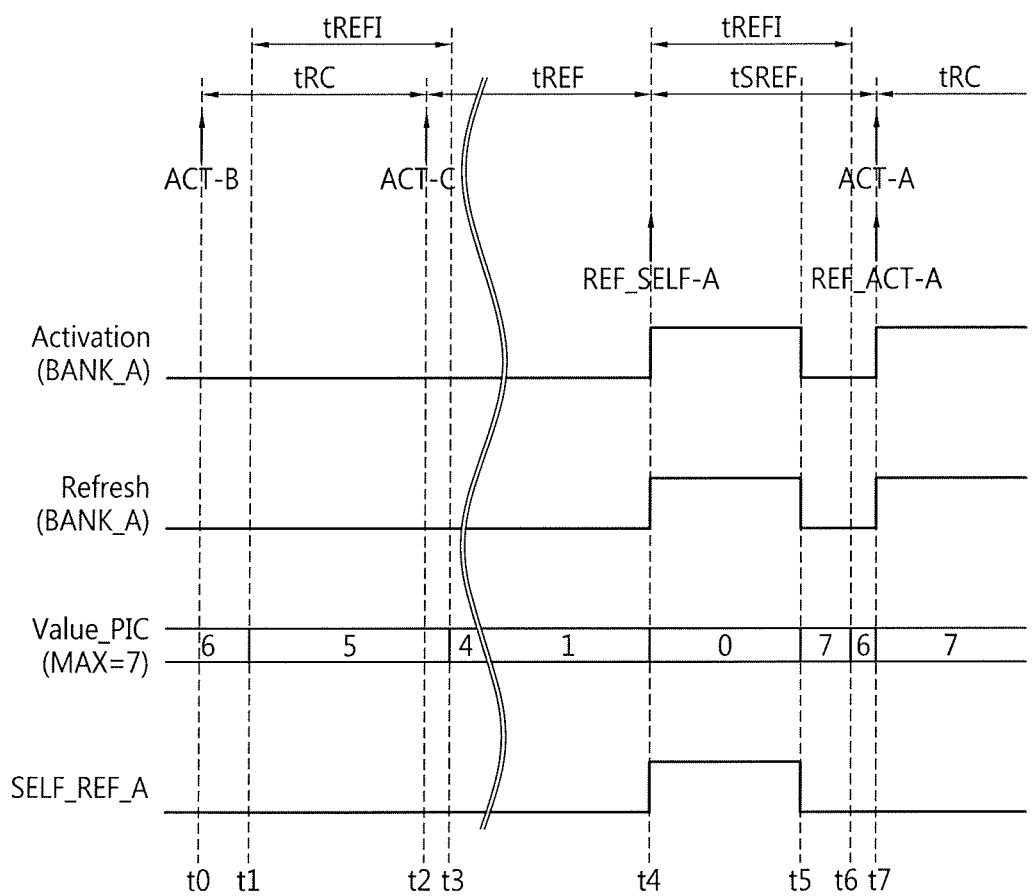
FIG. 6 is a timing diagram of a self-refresh operation of the semiconductor memory device of FIG. 2 according to according to an exemplary embodiment of the present inventive concept.
Figure 7:
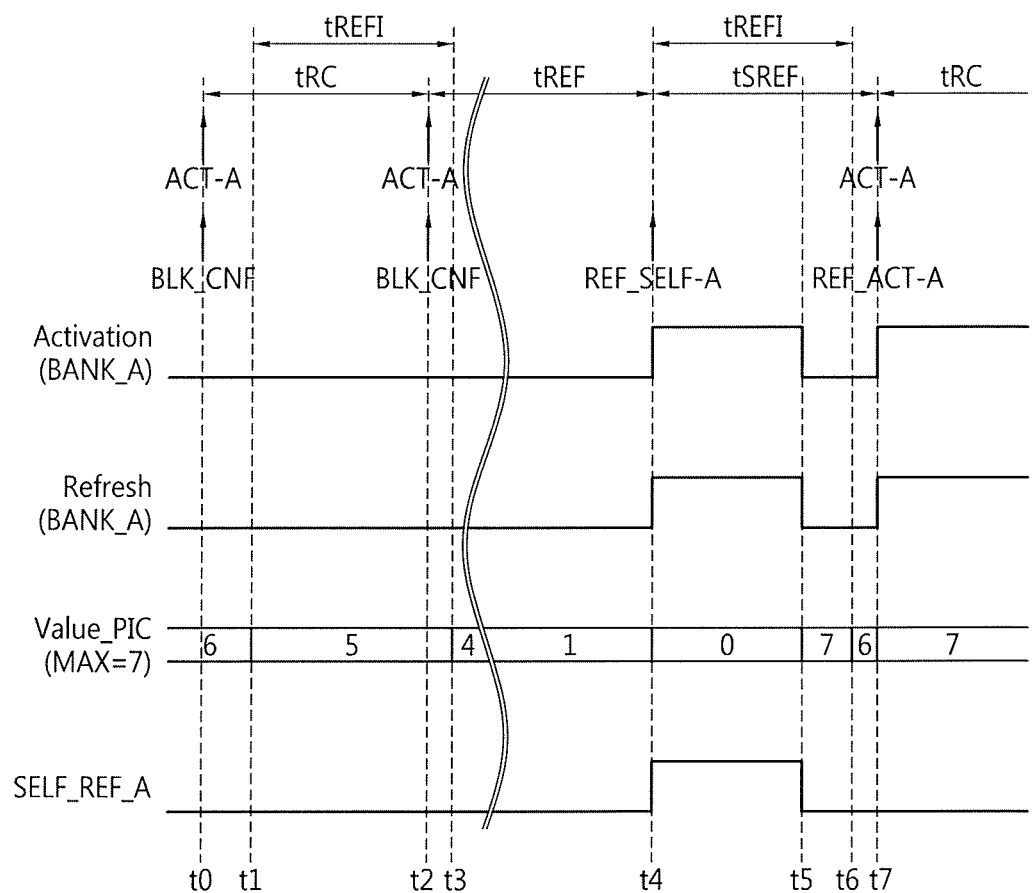
FIG. 7 is a timing diagram of a self-refresh operation in the semiconductor memory device of FIG. 2 according to an exemplary embodiment of the present inventive concept.
Figure 8:
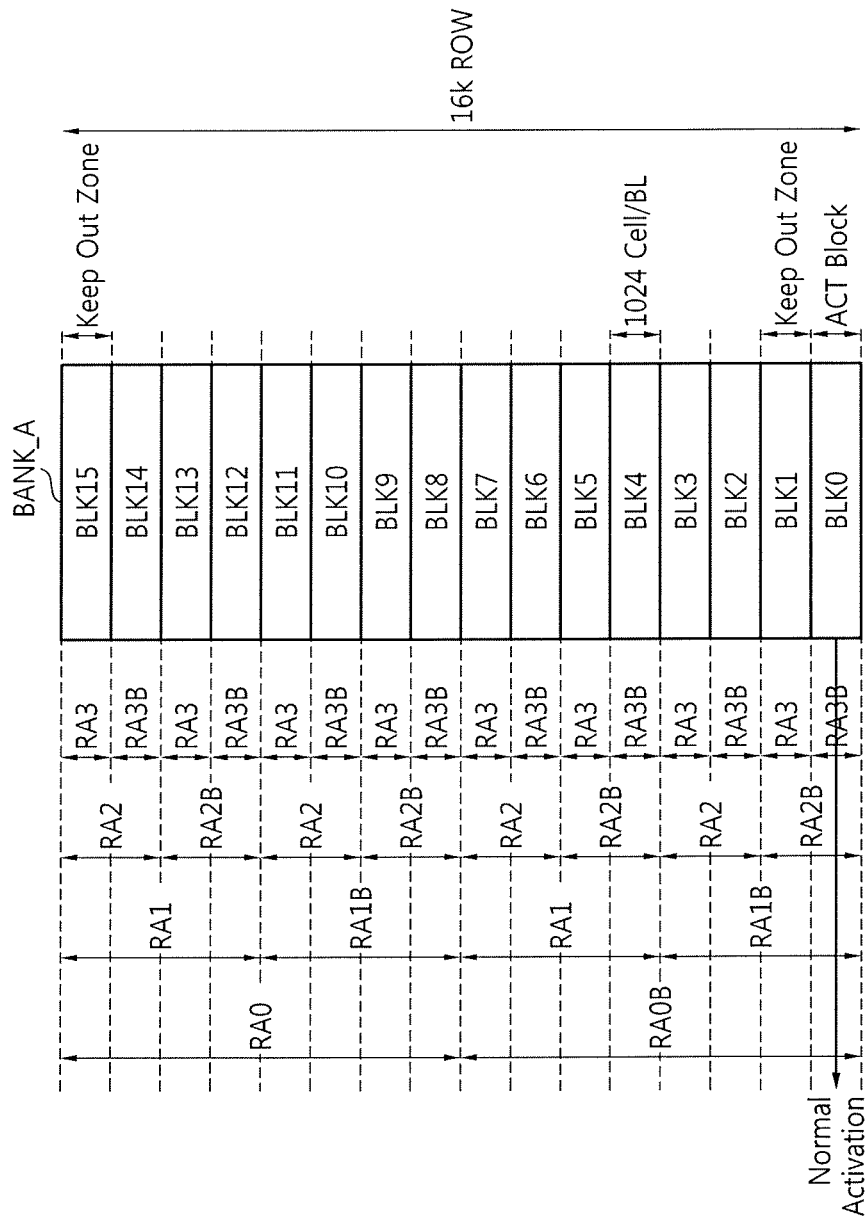
FIG. 8 is a conceptual diagram of a method of addressing word lines in a bank of FIG. 3 according to an exemplary embodiment of the present inventive concept.

FIG. 6 is a timing diagram of a self-refresh operation in the semiconductor memory device 100 of FIG. 2 according to an exemplary embodiment of the present inventive concept. FIG. 7 is a timing diagram of a self-refresh operation in the semiconductor memory device 100 of FIG. 2 according to an exemplary embodiment of the present inventive concept. FIG. 8 shows a method of addressing word lines in the first bank BANK_A of FIG. 3. FIG. 9 is a timing of a self-refresh operation in the semiconductor memory device 100 of FIG. 2 according to an exemplary embodiment of the present inventive concept.

Referring to FIGS. 1 through 9, FIG. 6 shows the timing diagram of the self-refresh operation of the semiconductor memory device 100 when the first bank BANK_A is in a refresh starvation wherein a refresh operation is performed on the first bank BANK_A within a refresh window tREFW. A self-refresh period tSREF is duration from the start of a self-refresh operation on a block to a time when activation of the block for a normal operation becomes possible after the self-refresh operation ends. The commence of a self-refresh operation is denoted by REF_SELF-A.

As an activation command for a bank BANK_B is received at the time point t0, the second bank unit 200B may perform an operation of activating a row in a second bank (not shown) and an active refresh operation. As the refresh time tREFI has elapsed, the count value Value_PIC associated with the first bank BANK_A decreases from 6 to 5 at the time point t1.

As an activation command for a bank BANK_C is received at the time point t2, the third bank unit 200C may perform an operation of activating a row in a third bank (not shown) and an active refresh operation. As the refresh time tREFI has elapsed, the count value Value_PIC associated with the first bank BANK_A decreases from 5 to 4 at the time point t3. An activation command for the bank BANK_A has not been issued before time t4, and thus the count value Value_PIC decreases to 0 at time t4.

Accordingly, the self-refresh signal SELF_REF_A transits to the high level at time t4. As the self-refresh signal SELF_REF_A transits to the high level, the first bank unit 200A may perform a self-refresh operation on the first bank BANK_A using the refresh activation address RAA which is internally generated.

When the self-refresh operation is completed at the time point t5, the first pull-in counter 165A may reset the count value Value_PIC to 7. The reset value is not restricted to 7 and may be randomly determined.

As the refresh time tREFI has elapsed, the count value Value_PIC decreases from 7 to 6 at the time point t6. As an activation command for the bank BANK_A is received at the time point t7, the first bank unit 200A may perform an operation of activating a row corresponding to the normal activation address NAA and an active refresh operation corresponding to the refresh activation address RAA. At this time, as the active refresh operation is performed, the count value Value_PIC increases from 6 to 7.

If the bank BANK_A is in a refresh starvation, a self-refresh operation is performed on the bank BANK_A. The refresh starvation may be determined using the first pull-in counter 165A, and thus if an active refresh is performed mainly on a specific bank within a refresh window tREFW, a self-refresh operation is performed on the remaining bank which is in a refresh starvation.

FIG. 7 shows the timing diagram of the self-refresh operation of the semiconductor memory device 100 if block conflict occurs between the first bank BANK_A and other banks adjacent to the first bank BANK_A. If an activation command for the bank BANK_A is received at the time point t0, an operation of activating a row corresponding to the normal activation address NAA may be performed, but an active refresh operation is not performed because of block conflict in which a block including a row corresponding to the refresh activation address RAA is adjacent to a block including a row corresponding to the normal activation address NAA. The block where an active refresh operation is prohibited due to the block conflict may be referred to a keep-out zone.

As the refresh time tREFI has elapsed, the count value Value_PIC decreases from 6 to 5 at the time point t1.

When an activation command for the bank BANK_A is received at the time point t2 like at the time point t0, an operation of activating a row corresponding to the normal activation address NAA may be performed, but an active refresh operation is not performed because of block conflict in which a block including a row corresponding to the refresh activation address RAA is in a keep-out zone.

As the refresh time tREFI has elapsed, the count value Value_PIC decreases from 5 to 4 at the time point t3. If a block conflict occurs on the first bank BANK_A until time t4, the count value Value_PIC of the first bank unit BANK_A decreases to 0 at the time point t4. Accordingly, the self-refresh signal SELF_REF_A transits to the high level. As the self-refresh signal SELF_REF_A transits to the high level at the time t4, the first bank unit 200A may perform a self-refresh operation corresponding to the refresh activation address RAA on the first bank unit BANK_A.

If the self-refresh operation is completed at the time point t5, the first pull-in counter 165A may reset the count value Value_PIC to 7. The reset value is not restricted to 7 and may be randomly determined. The reset value may be changed after a predetermined delay when necessary (for example, according to the control of the TCSR unit 170 when internal temperature is very high or rapidly changes).

As the refresh time tREFI has elapsed, the count value Value_PIC decreases from 7 to 6 at the time point t6. As an activation command for the bank BANK_A is received at the time point t7, the first bank unit 200A may perform an operation of activating a row corresponding to the normal activation address NAA and an active refresh operation corresponding to the refresh activation address RAA. At this time, as the active refresh operation is performed, the count value Value_PIC increases from 6 to 7.

If block conflict continues to occur on a bank without an active refresh operation for a refresh window tREFW, a self-refresh operation corresponding to the refresh activation address RAA may be performed using the first pull-in counter 165A on the bank to refresh data stored in memory cells of the bank.

FIG. 8 shows a method of addressing word lines in the blocks BLK0 through BLK15 of the bank BANK_A according to an exemplary embodiment of the present inventive concept. For the convenience of description, it is assumed that the number of word lines included in each of the blocks BLK0 through BLK15 is 1024. In this case, a total number of word lines included in the bank BANK_A is 16*1024.

If the memory controller 300 accesses to memory cells of which row addresses RA are localized within a narrow row address space for a refresh window tREFW, the data may be stored in memory cells of which row addresses RA may change sequentially. In this case, the memory controller 300 access to a specific block only within a bank unit without accessing other blocks, and thus the bank unit is subject to refresh starvation. To avoid such refresh starvation, a self-refresh operation is performed on the bank. For instance, if a row address RA changes sequentially in a first bank BANK_A, and if the row address RA includes 100 rows within the first block BLK0 only to be accessed for a refresh window tREFW, an active refresh operation cannot be performed on the first block BLK0 and the blocks BLK1 and BLK15 which are adjacent to the first block BLK0 for the refresh window tREFW. The BLK1 and BLK15 are within a keep-out zone of the first block BLK0. In this case, the semiconductor memory device 100 may performs a self-refresh operation on the first bank BANK_A to prevent data loss of the blocks BLK1 and BLK15 without control of the memory controller 300. In an exemplary embodiment, the self-refresh operation may be performed so that remaining row addresses other than the localized row addresses are refreshed to avoid refresh starvation. For example, memory cells associated the remaining row addresses may be refreshed within the refresh window tREFW by the self-refresh operation.

To avoid such address localization in a specific block in a bank unit, the row address RA is scrambled such that memory access by a memory controller is spread out among the blocks BLK0 through BLK15 in a first bank BANK_A, for example. For the convenience of description, the row address RA is assumed to is made up of 16 bits and the first bank BANK_A includes 16 blocks BLK0 through BLK15. In this case, the row address RA is scrambled such that four consecutive upper bits including the most significant bit (MSB) and four consecutive lower bits including the least significant bit (LSB) are switched. Without the scrambling, the four consecutive upper bits may be used to select one of the 16 blocks BLK0 to BLK15 and the four consecutive lower bits may be used to select a block selected by the four consecutive upper bits. Accordingly, if the row address RA change sequentially, memory access is localized into a specific block. In an exemplary embodiment, the scrambling may move the four consecutive lower bits into higher bit positions and the four consecutive upper bits into lower bit positions. Accordingly, if the row address RA changes sequentially, the block address of the scrambled address continues to change such that memory access is spread out among the blocks BLK0 through BLK15 of the first bank unit BANK_A. In detail, when the LSB has a value of RA0 (e.g., 1) or RA0B (e.g., 0), the bit may be addressed to distinguish the blocks BLK0 through BLK7 from the blocks BLK8 through BLK15. When the first upper bit than the LSB has a value of RA1 (e.g., 1) or RA1B (e.g., 0), the bit may be addressed to distinguish the blocks BLK0 through BLK3 from the blocks BLK4 through BLK7 or distinguish the blocks BLK8 through BLK11 from the blocks BLK12 through BLK15. When the second and third upper bits than the LSB are addressed in such a manner, all of the blocks BLK0 through BLK7 and BLK8 through BLK15 may be distinguished from one another by the four bits.

When the row address RA addressed in this manner is used and data is stored at the row address RA, which changes sequentially when viewed from the perspective of the memory controller 300, in the bank BANK_A, the data may be stored among the blocks BLK0 to BLK15 without being stored in a specific block only.

If the row address RA is scrambled in the above-described manner, refresh starvation of a bank may be less likely to happen compared to a row address without address scramble. In addition, when a row corresponding to the normal activation address NAA is the same as or adjacent to a row corresponding to the refresh activation address RAA, continuous block conflict may be prevented.

FIG. 9 is the timing diagram of an error information signal generated during a self-refresh period tSREF according to an exemplary embodiment. If an activation command is in conflict with a self-refresh, a memory controller detects which activation command is in conflict, waits until the self-refresh operation is completed, and then re-issue the activation command An operation of receiving a write command for the third bank unit 200C is denoted by WR-C, an operation of receiving a read command for the third bank unit 200C is denoted by RD-C, and an operation of receive a read command for the first bank unit 200A is denoted by RD-A.

At the time point t0, a write command for the third bank unit 200C is received and the third bank unit 200C starts a write operation corresponding to the write command. As the self-refresh signal SELF_REF_A transits to the high level at the time point t1, the first bank unit 200A starts a self-refresh operation corresponding to the refresh activation address RAA. As an active command for the first bank unit 200A is received at the time point t2 during the self-refresh operation on the first bank unit 200A, the bank activation logic 140 generates the activation impossibility signal AIS at the high level.

As a read command for the third bank unit 200C is received at the time point t3 during the self-refresh operation on the first bank unit 200A, the third bank unit 200C starts a read operation corresponding to the read command. At the time point t4, the error information generator 180 may generate the error information EI having a predetermined error latency Error_Latency for the activation command causing the error information EI.

As a read command for the first bank unit 200A is received at the time point t5 during the self-refresh operation on the first bank unit 200A, the bank activation logic 140 generates the activation impossibility signal AIS at the high level.

At the time point t6, the self-refresh operation on the first bank unit 200A ends. At the time point t7, the error information generator 180 may generate the error information EI having the predetermined error latency Error_Latency for the read command causing the error information EI.

At the time point t8, the memory controller 300 may recognize that the activation command issued for the first bank unit 200A at the time point t2 has not been processed based on the error latency Error_Latency of the error information EI. Accordingly, the memory controller 300 may reissue the activation command for the first bank unit 200A after the self-refresh period tSREF ends.

Figure 10:
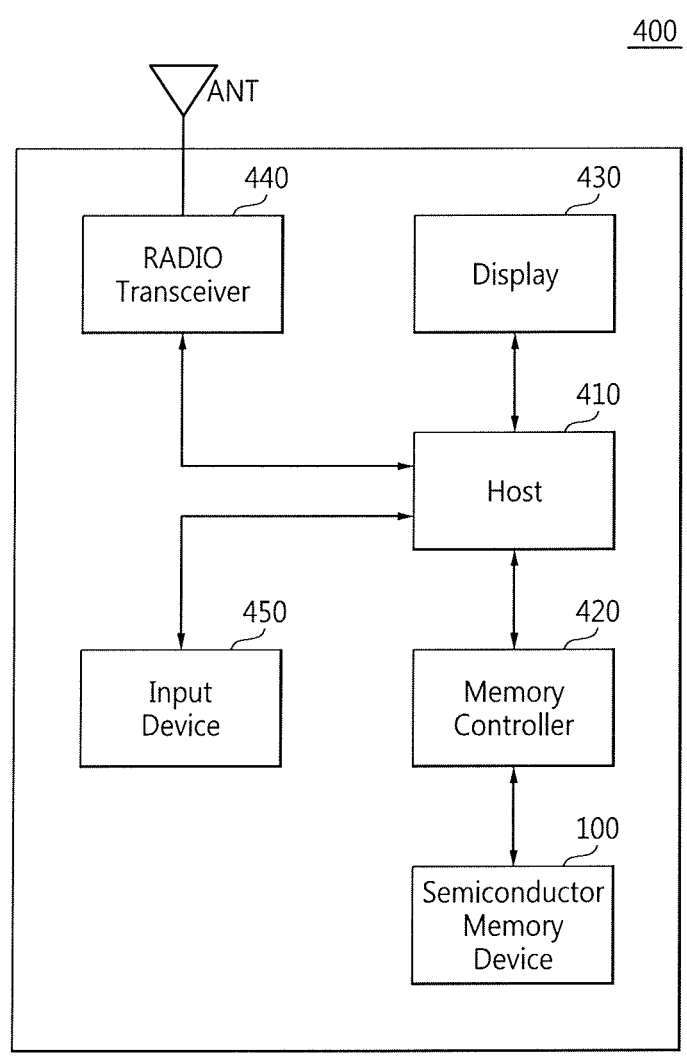
FIG. 10 is a diagram of a computer system including the semiconductor memory device of FIG. 1 according to an exemplary embodiment of the present inventive concept.

FIG. 10 is a diagram of a computer system 400 including the semiconductor memory device 100 of FIG. 1 according to an exemplary embodiment of the present inventive concept. Referring to FIGS. 1 and 10, the computer system 400 may be implemented as a cellular phone, a smart phone, a personal digital assistant (PDA), or a wireless communication device.

The computer system 400 includes the semiconductor memory device 100 and a memory controller 420 controlling the operation of the semiconductor memory device 100.

The memory controller 420 may control a data access operation, e.g., a write operation or a read operation, of the semiconductor memory device 100 according to the control of a host 410. The memory controller 420 may be the memory controller 300 illustrated in FIG. 1.

Data of the semiconductor memory device 100 may be displayed through a display 430 according to the control of the host 410 and the memory controller 420. A radio transceiver 440 may transmit or receive radio signals through an antenna ANT. The radio transceiver 440 may convert radio signals received through the antenna ANT into signals that may be processed by the host 410. Accordingly, the host 410 may process the signals received from the radio transceiver 440 and transmit the processed signals to the memory controller 420 or the display 430. The memory controller 420 may store the signals processed by the host 410 in the semiconductor memory device 100. The radio transceiver 440 may also convert signals received from the host 410 into radio signals and output the radio signals to an external device through the antenna ANT.

An input device 450 may control the operation of the host 410 or data to be processed by the host 410 to be input to the semiconductor memory device 100. The input device 450 may be implemented as a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be implemented as a part of the host 410 or as a separate chip.

Figure 11:
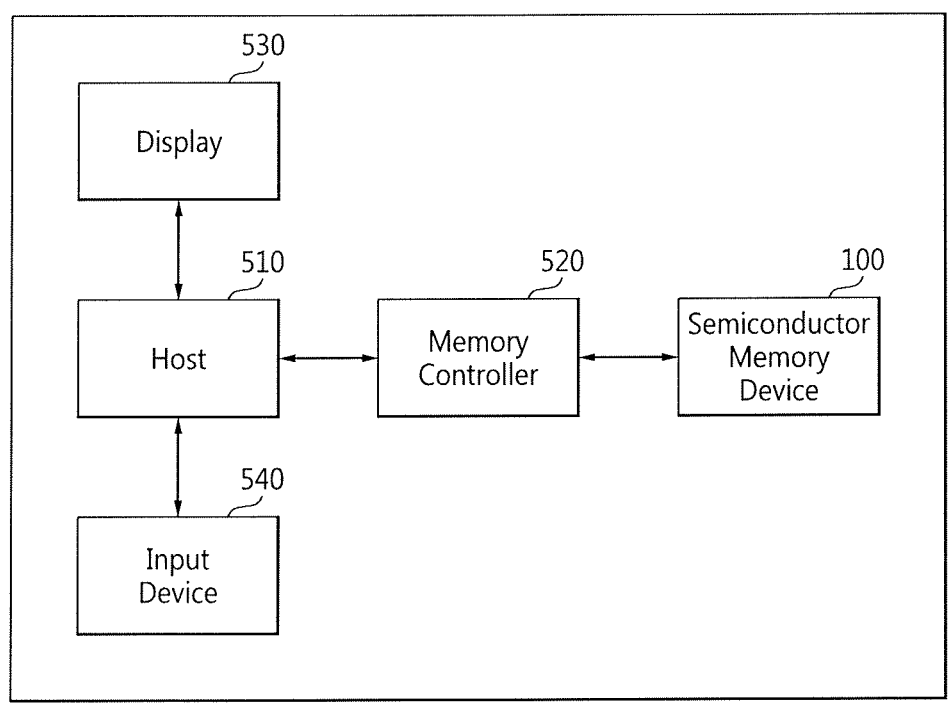
FIG. 11 is a block diagram of a computer system including the semiconductor memory device of FIG. 1 according to an exemplary embodiment of the present inventive concept.

FIG. 11 is a block diagram of a computer system 500 including the semiconductor memory device 100 of FIG. 1 according to an exemplary embodiment of the present inventive concept. The computer system 500 may be implemented as a personal computer (PC), a tablet PC, a net-book, an e-reader, a personal digital assistant (PDA), a portable multimedia player (PMP), an MP3 player, or an MP4 player.

The computer system 500 includes a host 510, the semiconductor memory device 100, a memory controller 520 controlling the data processing operations of the semiconductor memory device 100, a display 530 and an input device 540.

The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520 may be the memory controller 300 illustrated in FIG. 1.

According to an exemplary embodiment, the memory controller 520, which may control the operations of the semiconductor memory device 100, may be implemented as a part of the host 510 or as a separate chip.

Figure 12:
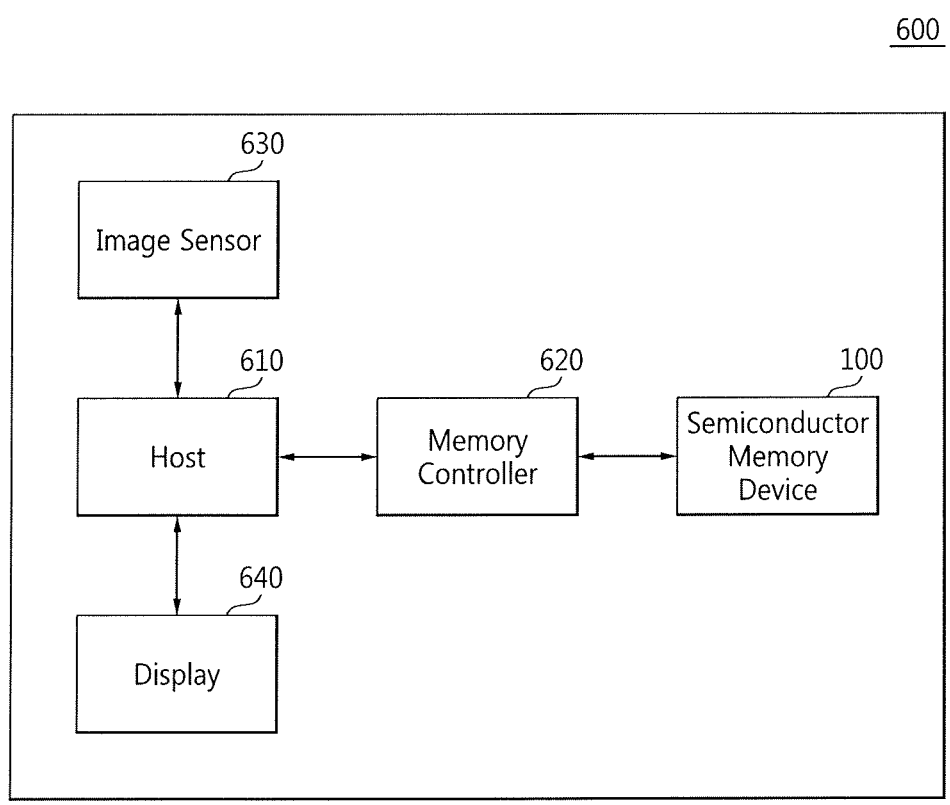
FIG. 12 is a block diagram of a computer system including the semiconductor memory device of FIG. 1 according to an exemplary embodiment of the present inventive concept.

FIG. 12 is a block diagram of a computer system 600 including the semiconductor memory device 100 of FIG. 1 according to an exemplary embodiment of the present inventive concept. The computer system 600 may be implemented as an image processing device like a digital camera, a cellular phone equipped with a digital camera, or a smart phone equipped with a digital camera.

The computer system 600 includes a host 610, the semiconductor memory device 100 and a memory controller 620 controlling the data processing operations, such as a write operation or a read operation, of the semiconductor memory device 100. The computer system 600 further includes an image sensor 630 and a display 640

The image sensor 630 included in the computer system 600 converts optical images into digital signals and outputs the digital signals to the host 610 or the memory controller 620. The digital signals may be controlled by the host 610 to be displayed through the display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be implemented as a part of the host 610 or as a separate chip.

Figure 13:
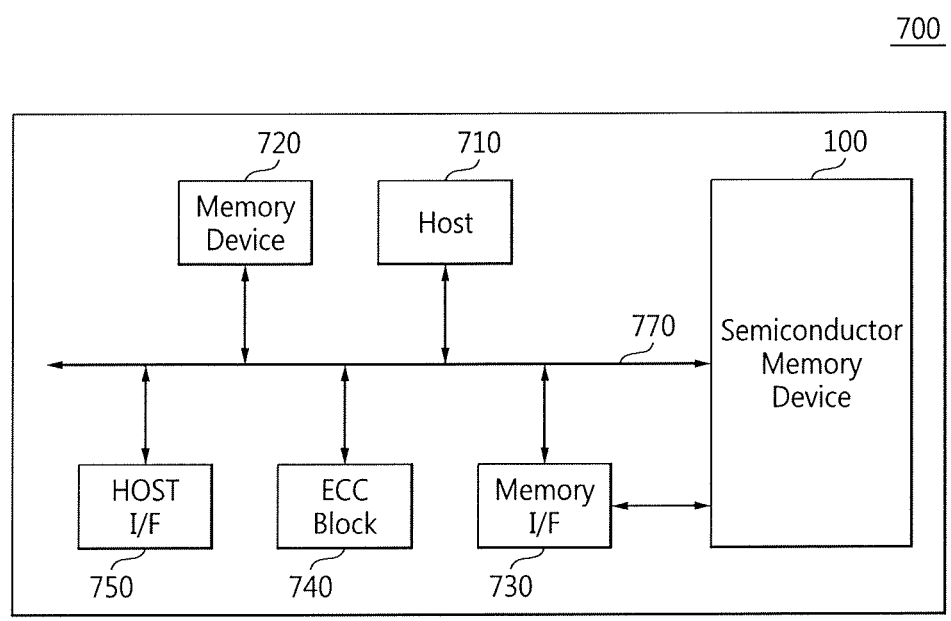
FIG. 13 is a block diagram of a computer system including the semiconductor memory device of FIG. 1 according to an exemplary embodiment of the present inventive concept.

FIG. 13 is a block diagram of a computer system 700 including the semiconductor memory device 100 of FIG. 1 according to an exemplary embodiment of the present inventive concept. The computer system 700 includes the semiconductor memory device 100 and a host 710 controlling the operations of the semiconductor memory device 100.

The computer system 700 also includes a system memory 720, a memory interface 730, an error correction code (ECC) block 740, and a host interface 750.

The system memory 720 may be used an operation memory of the host 710. The system memory 720 may be implemented by a non-volatile memory like read-only memory (ROM) or a volatile memory like static random access memory (SRAM).

The host 710 connected with the computer system 700 may perform data communication with the semiconductor memory device 100 through the memory interface 730 and the host interface 750.

The ECC block 740 is controlled by the host 710 to detect an error bit included in data output from the semiconductor memory device 100 through the memory interface 730, correct the error bit, and transmit the error-corrected data to the host through the host interface 750. The host 710 may control data communication among the memory interface 730, the ECC block 740, the host interface 750, and the system memory 720 through a bus 770. The computer system 700 may be implemented as a flash memory drive, a USB memory drive, an IC-USB memory drive, or a memory stick.

Figure 14:
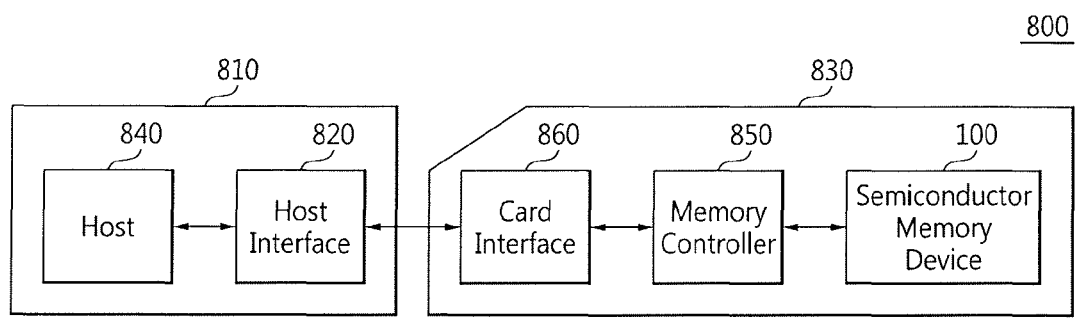
FIG. 14 is a block diagram of a computer system including the semiconductor memory device of FIG. 1 according to an exemplary embodiment of the present inventive concept.

FIG. 14 is a block diagram of a computer system 800 including the semiconductor memory device 100 of FIG. 1 according to an exemplary embodiment of the present inventive concept. The computer system 800 may be implemented as a host computer 810 and a memory card or a smart card. The computer system 800 includes the host computer 810 and the memory card 830.

The host computer 810 includes a host 840 and a host interface 820. The memory card 830 includes the semiconductor memory device 100, a memory controller 850, and a card interface 860. The memory controller 850 may control data exchange between the semiconductor memory device 100 and the card interface 860. The memory controller 850 may be the memory controller 300 illustrated in FIG. 1.

According to an exemplary embodiment, the card interface 860 may be a secure digital (SD) card interface or a multi-media card (MMC) interface, but the present inventive concept is not limited to the current embodiments.

When the memory card 830 is installed into the host computer 810, the card interface 860 may interface the host 840 and the memory controller 850 for data exchange according to a protocol of the host 840. The card interface 860 may support a universal serial bus (USB) protocol and an interchip (IC)-USB protocol. Here, the card interface 860 may indicate a hardware supporting a protocol used by the host computer 810, a software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to the control of the host 840.

Figure 15:
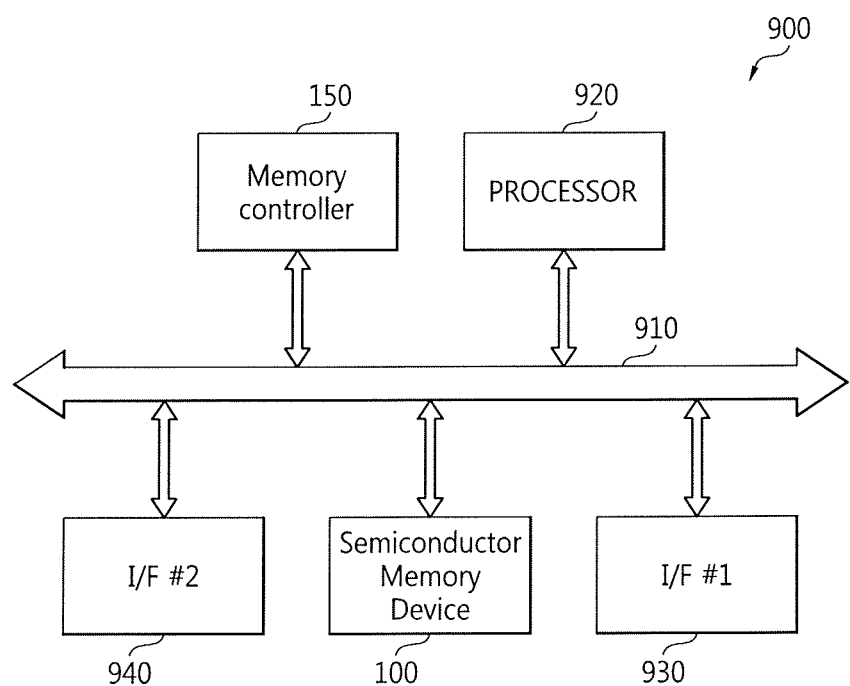
FIG. 15 is a block diagram of a computer system including the semiconductor memory device of FIG. 1 according to an exemplary embodiment of the present inventive concept.

FIG. 15 is a block diagram of a computer system 900 including the semiconductor memory device 100 of FIG. 1 according to an exemplary embodiment of the present inventive concept. The computer system 900 includes the semiconductor memory device 100, a memory controller 150, a processor 920 a first interface 930 and a second interface 940 which are connected to a data bus 910.

According to an exemplary embodiment, the computer system 900 may include a portable device such as a mobile phone, MP3 (MPECG Audio Layer-3) player, or MP4 (MPECG Audio Layer-4) player, a personal digital assistant (PDA), or a portable media player (PMP).

According to an exemplary embodiment, the computer system 900 may include a data processing system such as a personal computer (PC), a notebook-sized personal computer or a laptop computer.

According to an exemplary embodiment, the computer system 900 may include a memory card such as a secure digital (SD) card or a multimedia card (MMC)

According to an exemplary embodiment, the computer system 900 may include a smart card or a solid state drive (SSD)

The semiconductor memory device 100, the memory controller 150 and the processor 920 may be implemented as one chip, for example, a system on chip (SoC) or as separate devices.

According to an exemplary embodiment, the processor 920 may process data input through the first interface 930 and write the data in the semiconductor memory device 100.

According to an exemplary embodiment, the processor 920 may read data from the semiconductor memory device 100 and output the data through the first interface 930. In this case, the first interface 930 may be an input/output device.

The second interface 940 may be a wireless interface for wireless communication.

According to an exemplary embodiment, the second interface 940 may be implemented by software or firmware.

Figure 16:
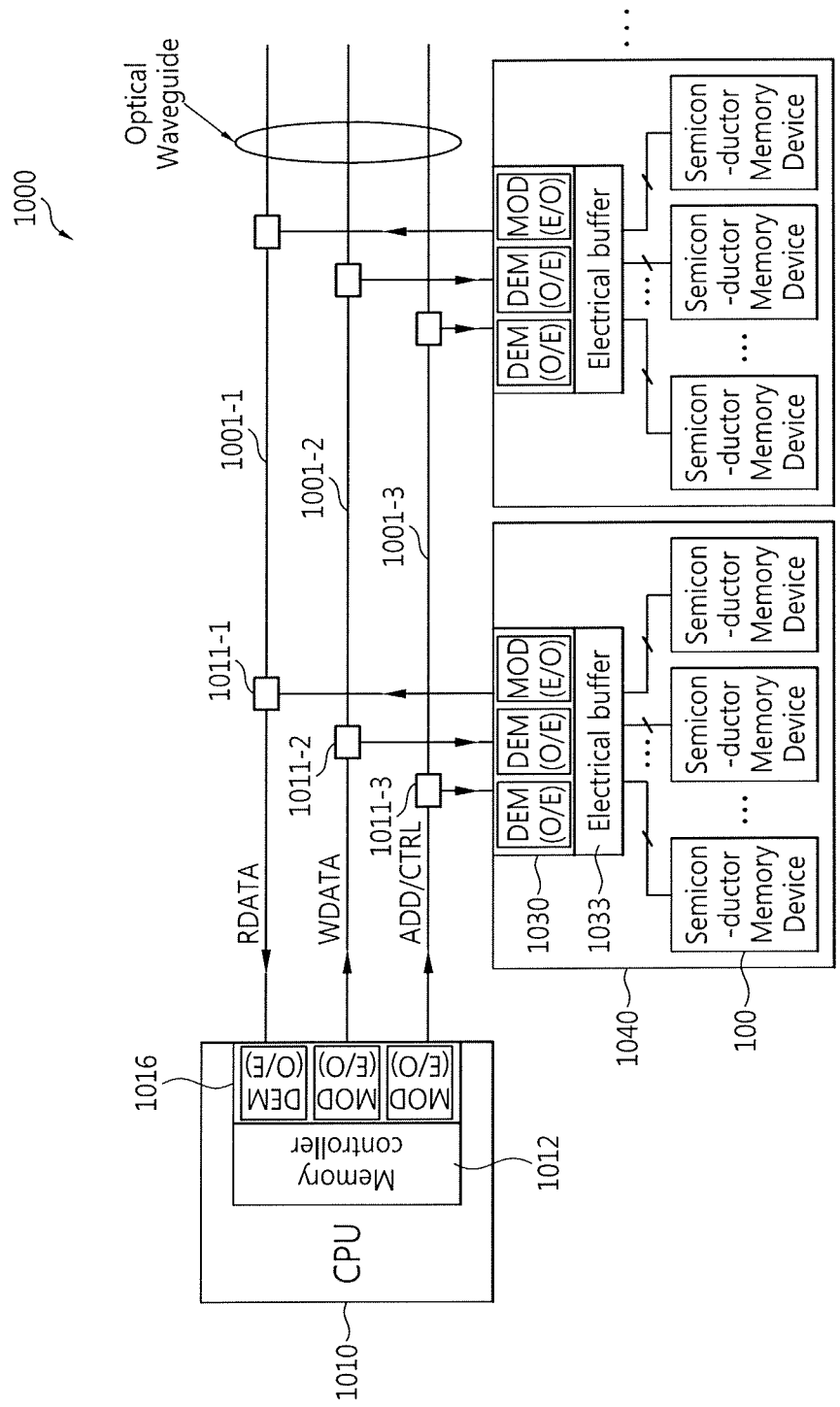
FIG. 16 is a block diagram of a data processing system including the semiconductor memory device of FIG. 1 according to an exemplary embodiment of the present inventive concept.

FIG. 16 is a block diagram of a data processing system 1000 including the semiconductor memory device 100 of FIG. 1 according to an exemplary embodiment of the inventive concept. In FIG. 16, MOD(E/O) denotes an optical modulator used as an E/O converter which converts electrical signal to optical signal, and DEM(O/E) denotes an optical demodulator used as an O/E converter which converts optical signal to electrical signal. Referring to FIG. 16, the data processing system 1000 includes a central processing unit (CPU) 1010, a plurality of data buses 1001-1, 1001-2, and 1001-3, and a plurality of memory modules 1040.

Each of the memory modules 1040 may transmit and receive optical signals through a plurality of couplers 1011-1, 1011-2, and 1011-3 respectively connected to the data buses 1001-1 through 1001-3. According to an exemplary embodiment, each of the couplers 1011-1 through 1011-3 may be implemented by an electrical coupler or an optical coupler.

The CPU 1010 includes a first optical transceiver 1016, which includes at least one optical modulator MOD(E/O) and at least one optical demodulator DEM(O/E), and a memory controller 1012. The optical demodulator DEM(O/E) is used as an O/E converter. The memory controller 1012 is controlled by the CPU 1010 to control the operations, e.g., the transmitting operation and the receiving operation, of the first optical transceiver 1016.

For instance, during a write operation, a first optical modulator MOD(E/O) of the first optical transceiver 1016 generates a modulated optical signal ADD/CTRL from addresses and control signals and transmits the optical signal ADD/CTRL to the optical communication bus 1001-3 in compliance with the memory controller 1012.

After the first optical transceiver 1016 transmits the optical signal ADD/CTRL to the optical communication bus 1001-3, a second optical modulator MOD(E/O) of the first optical transceiver 1016 generates modulated optical write data WDATA and transmits the optical write data WDATA to the data bus 1001-2.

Each of the memory modules 1040 includes a second optical transceiver 1030 and a plurality of memory devices 100. Each memory module 1040 may be implemented by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or an optical single in-line memory module (SIMM).

Referring to FIG. 16, an optical demodulator DEM(O/E) included in the second optical transceiver 1030 demodulates the optical write data WDATA received through the data bus 1001-2 and transmits a demodulated electrical signal to at least one of the memory devices 100.

Each memory module 1040 may also include an electrical buffer 1033 which buffers an electrical signal output from an optical demodulator DEM(O/E). For instance, the electrical buffer 1033 may buffer a demodulated electrical signal and transmits the buffered electrical signal to at least one of the memory devices 100.

During a read operation, an electrical signal output from the memory device 100 is modulated into optical read data RDATA by an optical modulator MOD(E/O) included in the second optical transceiver 1030. The optical read data RDATA is transmitted to a first optical demodulator DEM (O/E) included in the CPU 1010 through the data bus 1001-1. The first optical demodulator DEM(O/E) demodulates the optical read data RDATA and transmits a demodulated electrical signal to the memory controller 1012.

Figure 17:
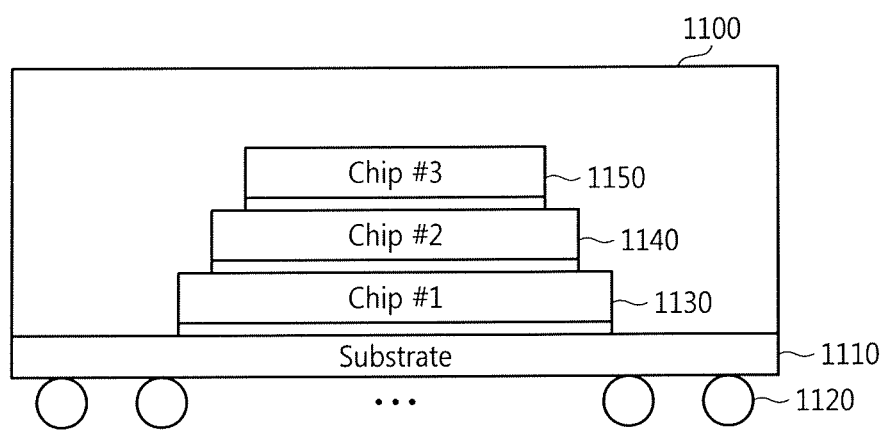
FIG. 17 is a schematic diagram of a multi-chip package including the semiconductor memory device of FIG. 1 according to an exemplary embodiment of the present inventive concept.

FIG. 17 shows a multi-chip package 1100 including the semiconductor memory device 100 illustrated in FIG. 1. Referring to FIGS. 1 and 17, the multi-chip package 1100 may include a plurality of semiconductor devices, i.e., first through third chips 1130, 1140, and 1150 which are sequentially stacked on a package substrate 1110. Each of the semiconductor devices 1130 through 1150 may include the semiconductor memory device 100. A memory controller (not shown) for controlling the operations of the semiconductor devices 1130 through 1150 may be included within at least one of the semiconductor devices 1130 through 1150 or may be implemented on the package substrate 1110. A through-silicon via (TSV) (not shown), a bonding wire (not shown), a bump (not shown), or a solder ball 1120 may be used to electrically connect the semiconductor devices 1130 through 1150 with one other. The memory controller (not shown) may be the memory controller 300 illustrated in FIG. 1.

For example, the first semiconductor device 1130 may be a logic die including an input/output interface and a memory controller and the second and third semiconductor devices 1140 and 1150 may be a die, on which a plurality of memory devices are stacked, and may include a memory cell array. At this time, a memory device of the second semiconductor device 1140 and a memory device of the third semiconductor device 1150 may be the same or different types of memory.

Alternatively, each of the first through third semiconductor devices 1130 through 1150 may include a memory controller. At this time, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory device may be positioned in the second or third semiconductor device 1140 or 1150. The memory device may be connected with the memory controller through a TSV.

The multi-chip package 1100 may be implemented using hybrid memory cube (HMC) in which a memory controller and a memory cell array die are stacked. When the HMC is used, the performance of memory devices increases due to the increase of bandwidth and the area of the memory devices is minimized. As a result, power consumption and manufacturing cost can be reduced.

Figure 18:
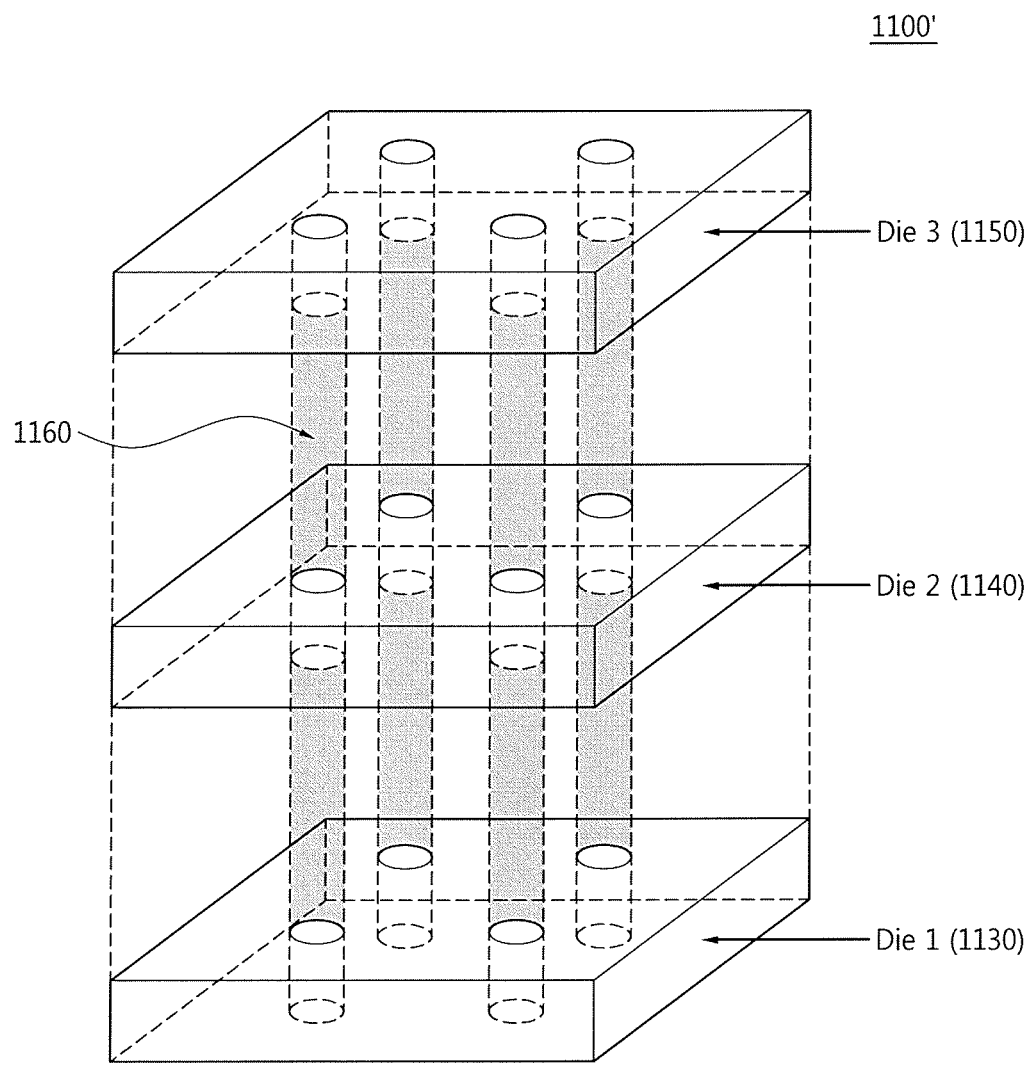
FIG. 18 is a three-dimensional diagram of the multi-chip package of FIG. 17 according to an exemplary embodiment of the present inventive concept.

FIG. 18 is a three-dimensional conceptual diagram of an example 1100' of the multi-chip package 1100 illustrated in FIG. 17. Referring to FIGS. 1, 17 and 18, the multi-chip package 1100' includes a plurality of the dies 1130 through 1150 connected with one another through TSVs 1160 in a stack structure. Each of the dies 1130 through 1150 may include a plurality of circuit blocks (not shown) and a periphery circuit to realize the functions of the semiconductor memory device 100. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate. The silicon substrate surrounds the TSVs 1160. An insulating region (not shown) may be disposed between the TSVs 1160 and the silicon substrate.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to an exemplary embodiment of the inventive concept, a refresh operation is performed in a semiconductor memory device without receiving an external refresh command from a memory controller. In addition, a row decoder that performs activation of a word line in response to an activation command is separated from a row decoder that performs a refresh operation and the refresh operation is performed in the background in the semiconductor memory device 100, so that the operation speed of the semiconductor memory device 100 is increased.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of operating a semiconductor memory device comprising: receiving a bank address for a first bank including a first word line, a second word line and a third word line;
receiving a first row address to activate the first word line for a read operation or a write operation;
generating a second row address to refresh a plurality of memory cells associated with the second word line;
generating a refresh clock signal of which period is a refresh time interval, decreasing a counter value upon elapse of each period of the refresh clock signal; and
increasing the counter value in response to completion of the refreshing,
wherein the semiconductor memory device generates the second row address.

2. The method of claim 1, further comprising:
if the first bank is not activated during a refresh window, generating a per-bank self-refresh signal.

3. The method of claim 1, further comprising:
activating the first word line using the first row address; and
refreshing the plurality of memory cells associated with the second word line using the second row address.

4. The method of claim 3,
wherein the activating and the refreshing are performed at substantially the same time.

5. The method of claim 1, further comprising:
generating a per-bank self-refresh signal associated with the first bank if the counter value reaches a predetermined minimum value during a refresh window; and
performing the per-bank self-refresh signal on the first bank.

6. The method of claim 1, further comprising:
generating a maximum refresh signal if the counter value reaches a predetermined maximum value during a refresh window, wherein the generating of the second row address is prohibited in response to the maximum refresh signal.

7. The method of claim 3, further comprising:
decoding the second row address; and
generating a refresh done signal if the refreshing of the plurality of memory cells is completed.

8. The method of claim 5, further comprising:
outputting an error signal to a memory controller if a second activation command is issued to the bank during the performing of the per-bank self-refresh signal on the bank; and
performing the second active command after completion of the performing the per-bank self-refresh signal.

9. A semiconductor memory device comprising:
a command decoder generating an activation command;
a bank activation logic receiving a bank address and the activation command and generating a bank activation signal; and
a plurality of memory bank units including a first bank unit,
wherein if the bank address indicates to the first bank unit, the first bank unit performs the activation command and an active refresh operation and generates a first refresh done signal, and if the bank address does not indicate to the first bank unit for a predetermined time, the first bank unit performs a per-bank self-refresh operation,
wherein performing of the activation command and performing of the active refresh operation are initiated by the bank activation signal,
wherein if the bank activation logic detects an activation conflict from the first bank unit, the bank activation logic further generates an activation impossibility signal and the generating of the bank activation signal for the first bank unit is performed after completion of a first per-bank self-refresh operation which is being performed on the first bank unit, and
wherein the activation conflict occurs if the activation command is issued to the first bank unit which is performing the first per-bank self-refresh operation.

10. The semiconductor memory device of claim 9,
wherein the performing of the activation command and the performing of the active refresh operation start at substantially the same, and wherein after the performing of the active refresh operation is completed, the first refresh done signal is generated.

11. The semiconductor memory device of claim 9, further comprising:
an error information generator receiving the activation impossibility signal and providing error information to a memory controller.

12. The semiconductor memory device of claim 9,
wherein the first bank unit comprises: a plurality of memory blocks, wherein the memory blocks are arranged in an open bitline architecture having a bitline sense amplifier shared by two adjacent blocks; a refresh row address generator generating a refresh activation address; a row decoder receiving a normal activation address and the refresh activation address; and wherein if the row decoder decodes the refresh activation address, the row decoder generates the first refresh done signal, and wherein if the normal activation address is associated with a first word line within a first block and if the refresh activation address is associated with a second word line within a second block which is spaced apart at least one block from the first block, the row decoder decodes the refresh activation address.

13. The semiconductor memory device of claim 12,
wherein if the second block is adjacent to the first block, the row decoder does not decode the refresh activation address.

14. The semiconductor memory device of claim 12,
wherein the first bank unit further comprises: a first address driver receiving a row address and providing the normal activation address to the row decoder; a bank control logic receiving a per-bank self-refresh signal and the bank activation signal and generating a bank control signal; and an activation controller receiving the bank control signal and generating a first activation signal and a second activation signal, wherein the first activation signal is provided to the first address driver, wherein the second activation signal is provided to the refresh row address generator, and wherein a logic level of the first activation signal and a logic level of the second activation signal are determined according to the bank control signal.

15. A semiconductor memory system comprising:
a memory controller issuing a first activation command and a first row address;
a semiconductor memory receiving the first activation command and the first row address, generating a second row address, and activating a first word line selected by the first row address and refreshing a plurality of memory cells associated with the second row address,
wherein the refreshing and the activating are initiated by the first activation command,
wherein the semiconductor memory includes a plurality of bank units,
wherein if a bank unit is not refreshed for a refresh window, the bank unit performs a per-bank self-refresh operation in response to a per-bank self-refresh signal generated from the bank unit, and
wherein if the first active command is issued to the bank unit which is performing the per-bank self-refresh operation, the semiconductor memory sends error information to the memory controller, without performing the first active command.

16. The semiconductor memory system of claim 15, wherein the activating and the refreshing start at substantially the same time.

17. The semiconductor memory system of claim 15, wherein the per-bank self-refresh operation is performed on remaining row addresses of the bank unit other than the second row address.

* * * * *